US012649298B2

(12) United States Patent
Shin et al.

(10) Patent No.: US 12,649,298 B2
(45) Date of Patent: Jun. 9, 2026

(54) WINDOW MODULE AND DISPLAY DEVICE INCLUDING THE SAME

(71) Applicant: Samsung Display Co., LTD., Yongin-si (KR)

(72) Inventors: Heonjung Shin, Yongin-si (KR); Kwangsig Jung, Yongin-si (KR); Sangho Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 379 days.

(21) Appl. No.: 18/222,805

(22) Filed: Jul. 17, 2023

(65) Prior Publication Data

US 2024/0126342 A1 Apr. 18, 2024

(30) Foreign Application Priority Data

Oct. 13, 2022 (KR) ........................ 10-2022-0131805

(51) Int. Cl.
*B32B 7/022* (2019.01)
*B32B 7/12* (2006.01)
(Continued)

(52) U.S. Cl.
CPC .............. *B32B 7/022* (2019.01); *B32B 7/12* (2013.01); *B32B 17/10614* (2013.01); *B32B 27/06* (2013.01); *B32B 27/08* (2013.01); *B32B 27/14* (2013.01); *B32B 27/20* (2013.01); *B32B 27/281* (2013.01); *B32B 27/283* (2013.01); *B32B 27/308* (2013.01); *B32B 27/34* (2013.01); *B32B 27/36* (2013.01); *B32B 27/365* (2013.01);
(Continued)

(58) Field of Classification Search
None
See application file for complete search history.

(56) References Cited

U.S. PATENT DOCUMENTS

2002/0025441 A1* 2/2002 Hieda ............... B32B 17/10018
428/440
2005/0077826 A1* 4/2005 Watanabe ............... B32B 27/36
313/587
(Continued)

FOREIGN PATENT DOCUMENTS

CN 102627003 A 8/2012
CN 102825889 A * 12/2012
(Continued)

OTHER PUBLICATIONS

Machine Translation of CN103214891A, Jul. 2013 (Year: 2013).*
(Continued)

*Primary Examiner* — Jeffrey A Vonch
(74) *Attorney, Agent, or Firm* — CANTOR COLBURN LLP

(57) ABSTRACT

A window module includes a base film being optically clear and a window protection layer disposed on the base film. The window protection layer includes a barrier layer disposed on the base film, an impact absorbing layer disposed between the base film and the barrier layer, and a first impact transmitting layer disposed between the barrier layer and the impact absorbing layer. A modulus of the impact absorbing layer is less than a modulus of the barrier layer, and the first impact transmitting layer includes graphene or carbon nanotubes.

15 Claims, 13 Drawing Sheets

(51) Int. Cl.

| | |
|---|---|
| *B32B 17/10* | (2006.01) |
| *B32B 27/06* | (2006.01) |
| *B32B 27/08* | (2006.01) |
| *B32B 27/14* | (2006.01) |
| *B32B 27/20* | (2006.01) |
| *B32B 27/28* | (2006.01) |
| *B32B 27/30* | (2006.01) |
| *B32B 27/34* | (2006.01) |
| *B32B 27/36* | (2006.01) |
| *B32B 27/40* | (2006.01) |
| *G02F 1/1333* | (2006.01) |
| *G06F 1/16* | (2006.01) |
| *G09F 9/30* | (2006.01) |
| *H04M 1/02* | (2006.01) |
| *H05K 5/03* | (2006.01) |

(52) U.S. Cl.
CPC ........ *B32B 27/40* (2013.01); *G02F 1/133305* (2013.01); *G02F 1/133331* (2021.01); *G06F 1/1652* (2013.01); *G06F 1/1656* (2013.01); *G09F 9/301* (2013.01); *H04M 1/0268* (2013.01); *H05K 5/03* (2013.01); *B32B 17/10* (2013.01); *B32B 17/10027* (2013.01); *B32B 17/10165* (2013.01); *B32B 17/10366* (2013.01); *B32B 17/10724* (2013.01); *B32B 17/1077* (2013.01); *B32B 17/10779* (2013.01); *B32B 17/10798* (2013.01); *B32B 2307/412* (2013.01); *B32B 2307/558* (2013.01); *B32B 2313/04* (2013.01); *B32B 2333/12* (2013.01); *B32B 2367/00* (2013.01); *B32B 2369/00* (2013.01); *B32B 2375/00* (2013.01); *B32B 2379/08* (2013.01); *B32B 2383/00* (2013.01); *B32B 2551/00* (2013.01); *G02F 2202/28* (2013.01); *G06F 1/1616* (2013.01); *G06F 2203/04102* (2013.01); *H04M 1/0222* (2013.01); *Y10T 428/24942* (2015.01); *Y10T 428/24983* (2015.01); *Y10T 428/30* (2015.01)

(56) References Cited

U.S. PATENT DOCUMENTS

| | | | | |
|---|---|---|---|---|
| 2006/0047052 | A1* | 3/2006 | Barrera | B29C 48/37 524/495 |
| 2008/0145632 | A1* | 6/2008 | Nagami | B32B 27/36 428/480 |
| 2010/0129625 | A1* | 5/2010 | Zhu | B32B 27/18 977/773 |
| 2013/0177748 | A1* | 7/2013 | Hirai | B32B 27/283 428/203 |
| 2013/0295384 | A1* | 11/2013 | Ma | H10K 30/82 977/734 |
| 2014/0162009 | A1* | 6/2014 | Hwang | B32B 27/36 428/354 |
| 2014/0212659 | A1 | 7/2014 | Dai et al. | |
| 2015/0010742 | A1* | 1/2015 | Han | B32B 27/302 428/335 |
| 2015/0062028 | A1* | 3/2015 | Go | G06F 1/1616 345/173 |
| 2015/0198747 | A1* | 7/2015 | Winarski | G02B 1/14 361/679.21 |
| 2015/0207102 | A1* | 7/2015 | Jeong | H04M 1/0268 257/40 |
| 2015/0268697 | A1* | 9/2015 | Nam | G06F 1/1643 428/157 |
| 2015/0363030 | A1* | 12/2015 | Nam | G06F 3/041 345/173 |
| 2016/0221294 | A1* | 8/2016 | Choi | B32B 7/12 |
| 2016/0224068 | A1* | 8/2016 | Choi | G06F 3/045 |
| 2017/0263889 | A1* | 9/2017 | Seki | H10K 77/111 |
| 2018/0043659 | A1* | 2/2018 | Ovalle | B32B 27/12 |
| 2018/0053913 | A1* | 2/2018 | Lee | H10K 59/124 |
| 2018/0063980 | A1* | 3/2018 | Shin | B32B 27/40 |
| 2018/0088392 | A1* | 3/2018 | Park | G02F 1/133308 |
| 2018/0119282 | A1* | 5/2018 | Lu | B32B 27/286 |
| 2018/0175310 | A1* | 6/2018 | Lee | B32B 27/308 |
| 2018/0354227 | A1* | 12/2018 | Park | B32B 27/12 |
| 2019/0009505 | A1* | 1/2019 | Song | B32B 7/023 |
| 2019/0227196 | A1* | 7/2019 | Eagerton | G02C 1/00 |
| 2020/0028117 | A1* | 1/2020 | Eckert | B32B 27/325 |
| 2020/0044170 | A1* | 2/2020 | Seki | B32B 27/365 |
| 2020/0091458 | A1* | 3/2020 | Oh | H10K 59/8722 |
| 2020/0133342 | A1* | 4/2020 | Choi | B32B 23/08 |
| 2020/0266380 | A1* | 8/2020 | Shi | H10K 77/111 |
| 2021/0011510 | A1* | 1/2021 | Lee | G06F 1/1652 |
| 2021/0120691 | A1* | 4/2021 | Su | G06F 1/1652 |
| 2021/0349242 | A1 | 11/2021 | Yoo et al. | |
| 2021/0408403 | A1* | 12/2021 | Xu | H10K 71/00 |
| 2022/0022350 | A1* | 1/2022 | Eisaman | B32B 27/36 |
| 2022/0057834 | A1* | 2/2022 | Jang | G06F 1/1616 |
| 2022/0223816 | A1* | 7/2022 | Wu | H10K 77/111 |
| 2022/0388288 | A1* | 12/2022 | Carbajal | B32B 25/14 |
| 2022/0390988 | A1* | 12/2022 | Shi | C09D 175/04 |
| 2023/0256711 | A1* | 8/2023 | Connolly | B32B 7/12 428/212 |
| 2023/0311462 | A1* | 10/2023 | Chan | B32B 37/12 428/213 |
| 2023/0341904 | A1* | 10/2023 | Liang | B32B 15/085 |

FOREIGN PATENT DOCUMENTS

| | | | | | |
|---|---|---|---|---|---|
| CN | 103214891 | A | * | 7/2013 | |
| CN | 103984460 | A | * | 8/2014 | |
| CN | 205247023 | U | * | 5/2016 | |
| CN | 107610595 | A | * | 1/2018 | |
| CN | 109192876 | A | * | 1/2019 | G09F 9/301 |
| CN | 110211499 | A | * | 9/2019 | G09F 9/33 |
| CN | 110379307 | A | * | 10/2019 | H04M 1/18 |
| CN | 111009189 | A | * | 4/2020 | G09F 9/301 |
| CN | 213122928 | U | * | 5/2021 | |
| CN | 112876723 | A | * | 6/2021 | C01B 32/186 |
| CN | 113583584 | A | * | 11/2021 | G09F 9/00 |
| CN | 114596786 | A | * | 6/2022 | G09F 9/301 |
| CN | 115050263 | A | * | 9/2022 | G09F 9/301 |
| JP | 08300591 | A | * | 11/1996 | |
| JP | 2001266759 | A | * | 9/2001 | |
| JP | 2009037119 | A | * | 2/2009 | |
| JP | 2013202919 | A | * | 10/2013 | |
| KR | 20130117464 | A | * | 10/2013 | B32B 27/08 |
| KR | 20140075153 | A | * | 6/2014 | G06F 3/044 |
| KR | 20140093538 | A | * | 7/2014 | G02F 1/133308 |
| KR | 20150072901 | A | * | 6/2015 | B32B 27/08 |
| KR | 20160081831 | A | * | 7/2016 | B32B 27/08 |
| KR | 20180058075 | A | * | 5/2018 | G02B 1/04 |
| KR | 20190058327 | A | * | 7/2019 | G02F 1/133308 |
| KR | 102034657 | B1 | * | 11/2019 | G06F 1/1652 |
| KR | 1020200082015 | A | | 7/2020 | |
| KR | 102150390 | B1 | * | 9/2020 | B32B 17/1055 |
| KR | 102275644 | B1 | | 7/2021 | |
| KR | 102334954 | B1 | | 12/2021 | |
| WO | WO-2012096482 | A2 | * | 7/2012 | B32B 5/16 |
| WO | WO-2014065000 | A1 | * | 5/2014 | B32B 17/06 |
| WO | WO-2014193819 | A1 | * | 12/2014 | G06F 1/1626 |
| WO | WO-2022222883 | A1 | * | 10/2022 | G09F 9/301 |

OTHER PUBLICATIONS

Machine Translation of JP2013202919A, Oct. 2013 (Year: 2013).*
Machine Translation of KR20140075153A, Jun. 2014 (Year: 2014).*
Machine Translation of KR20140093538A, Jul. 2014 (Year: 2014).*
Machine Translation of KR102034657B1, Nov. 2019 (Year: 2019).*
Machine Translation of CN113583584A, Nov. 2021 (Year: 2021).*
Machine Translation of CN114596786A, Jun. 2022 (Year: 2022).*

(56) References Cited

OTHER PUBLICATIONS

Lee, et al., Dynamic mechanical behavior of multilayer graphene via supersonic projectile penetration, Science vol. 346, pp. 1092-1096 (Nov. 28, 2014).

* cited by examiner

WINDOW MODULE AND DISPLAY DEVICE INCLUDING THE SAME

This application claims priority to Korean Patent Application No. 10-2022-0131805, filed on Oct. 13, 2022, and all the benefits accruing therefrom under 35 U.S.C. § 119, the content of which in its entirety is herein incorporated by reference.

BACKGROUND

1. Field

Embodiments of the disclosure described herein relate to a window module and a display device including the same, and more particularly, relate to a window module disposed on a display panel.

2. Description of the Related Art

Multimedia electronic devices, such as a television, a mobile phone, a tablet computer, a car navigation device, a game machine, and the like, may include a display device for displaying an image. The display device may include a display panel and a window module that is disposed on the display panel and that protects the display panel from an external impact.

With a development of display device technology, various flexible display devices that can be curved, folded, or rolled are being developed. A shape of a flexible display device may be diversely deformed. Thus, the flexible display device may be easy to carry and may improve user convenience. A window module included in the flexible display device is desired to be capable of a rolling, folding, or bending operation and to have impact resistance sufficient to protect a display panel from an external impact.

SUMMARY

Embodiments of the disclosure provide a window module for effectively transmitting and dispersing an external impact while having impact resistance and a display device including the window module.

In an embodiment of the disclosure, a window module includes a base film being optically clear and a window protection layer disposed on the base film. The window protection layer includes a barrier layer disposed on the base film, an impact absorbing layer disposed between the base film and the barrier layer, and a first impact transmitting layer disposed between the barrier layer and the impact absorbing layer. A modulus of the impact absorbing layer is less than a modulus of the barrier layer, and the first impact transmitting layer includes graphene or carbon nanotubes.

In an embodiment, a thickness of the first impact transmitting layer may be about 0.1 nanometer (nm) or more and about 5 micrometers (μm) or less.

In an embodiment, a haze of the window protection layer may be about 3% or less.

In an embodiment, a light transmittance of the window protection layer may be about 80% or more.

In an embodiment, the modulus of the barrier layer may be about 2 gigapascals (GPa) or more and about 8 GPa or less.

In an embodiment, the modulus of the impact absorbing layer may be about 300 megapascals (MPa) or more and about 1.5 GPa or less.

In an embodiment, the barrier layer may include at least one of polyimide, polyethyleneterephthalate, polycarbonate, or polymethylmethacrylate.

In an embodiment, the impact absorbing layer may include at least one of thermoplastic polyurethane, thermoset polyurethane, polyether block amide, copolyester thermoplastic elastomer, or silicone.

In an embodiment, the first impact transmitting layer may contact a rear surface of the barrier layer.

In an embodiment, the window protection layer may further include an adhesive part disposed between the first impact transmitting layer and the impact absorbing layer.

In an embodiment, the first impact transmitting layer may include a resin having an adhesive force, and the graphene or the carbon nanotubes may be dispersed in the resin.

In an embodiment, the first impact transmitting layer may contact the barrier layer and the impact absorbing layer.

In an embodiment, the window protection layer may further include a second impact transmitting layer disposed on a rear surface of the impact absorbing layer, and the second impact transmitting layer may include graphene or carbon nanotubes.

In an embodiment, the first impact transmitting layer may contact an upper surface of the impact absorbing layer, and the second impact transmitting layer may contact the rear surface of the impact absorbing layer.

In an embodiment, the window module may further include a functional coating layer that is disposed on the window protection layer and that includes at least one of a hard coating layer, an anti-fingerprint layer, or an antistatic layer.

In an embodiment of the disclosure, a display device includes a display panel and a window module including a base film disposed on the display panel and a window protection layer disposed on the base film. The window protection layer includes a barrier layer, a first impact transmitting layer, and an impact absorbing layer sequentially disposed toward the base film in a thickness direction. A modulus of the impact absorbing layer is less than a modulus of the barrier layer, and the first impact transmitting layer includes graphene or carbon nanotubes.

In an embodiment, the window protection layer may further include a second impact transmitting layer disposed between the base film and the impact absorbing layer, and the second impact transmitting layer may include graphene or carbon nanotubes.

In an embodiment, a thickness of the first impact transmitting layer may be about 0.1 nanometer (nm) to about 5 micrometers (μm).

In an embodiment, the modulus of the barrier layer may be about 2 GPa to about 8 GPa, and the modulus of the impact absorbing layer may be about 300 MPa to about 1.5 GPa.

In an embodiment, a haze of the window protection layer may be about 3% or less, and a light transmittance of the window protection layer may be about 80% or more.

BRIEF DESCRIPTION OF THE DRAWINGS

The above and other embodiments, advantages and features of the disclosure will become apparent by describing in detail embodiments thereof with reference to the accompanying drawings.

DETAILED DESCRIPTION

Figure 1:
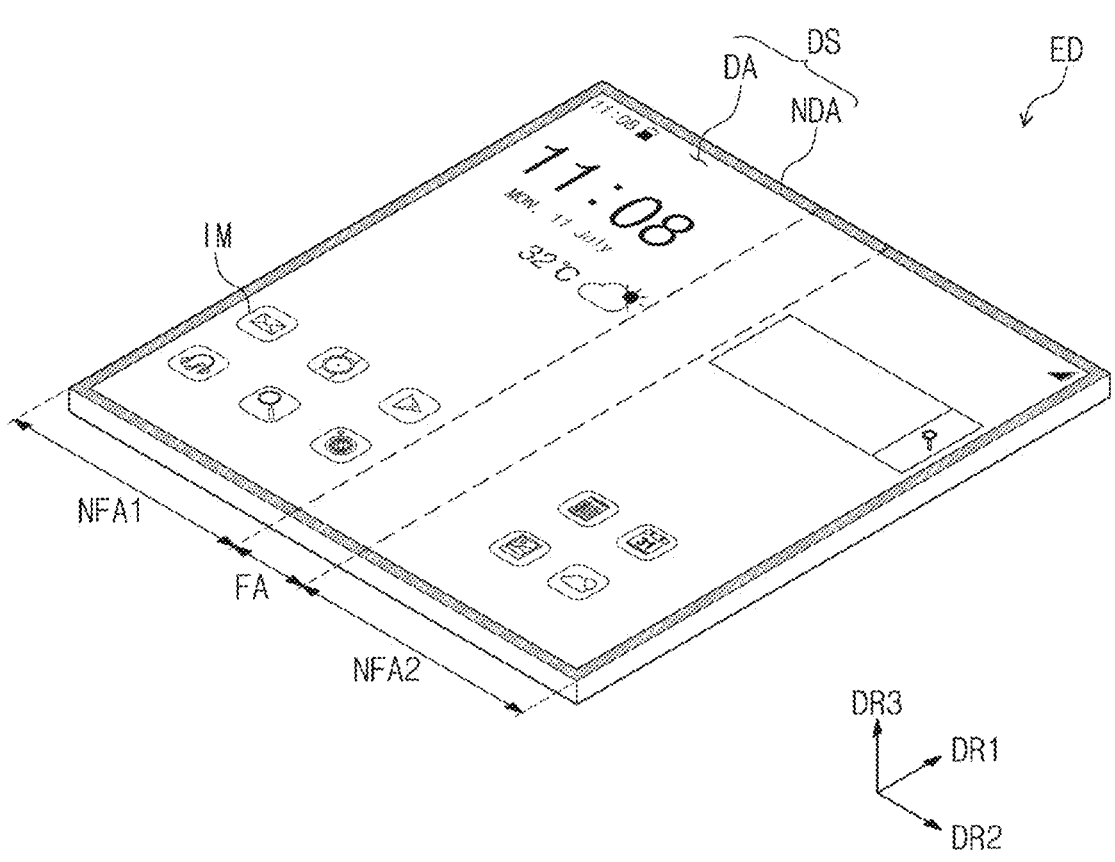
FIG. 1 is a perspective view of an embodiment of a display device according to the disclosure.

Various changes may be made to the disclosure, and various embodiments of the disclosure may be implemented. Thus, illustrative embodiments are illustrated in the drawings and described as examples herein. However, it should be understood that the disclosure is not to be construed as being limited thereto and covers all modifications, equivalents, and alternatives falling within the spirit and scope of the disclosure.

In this specification, when it is mentioned that a component (or, a region, a layer, a part, etc.) is referred to as being "on", "connected to" or "coupled to" another component, this means that the component may be directly on, connected to, or coupled to the other component or a third component may be therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

Hereinafter, a window module and a display device in an embodiment of the disclosure will be described with reference to the accompanying drawings.

Figure 2A:
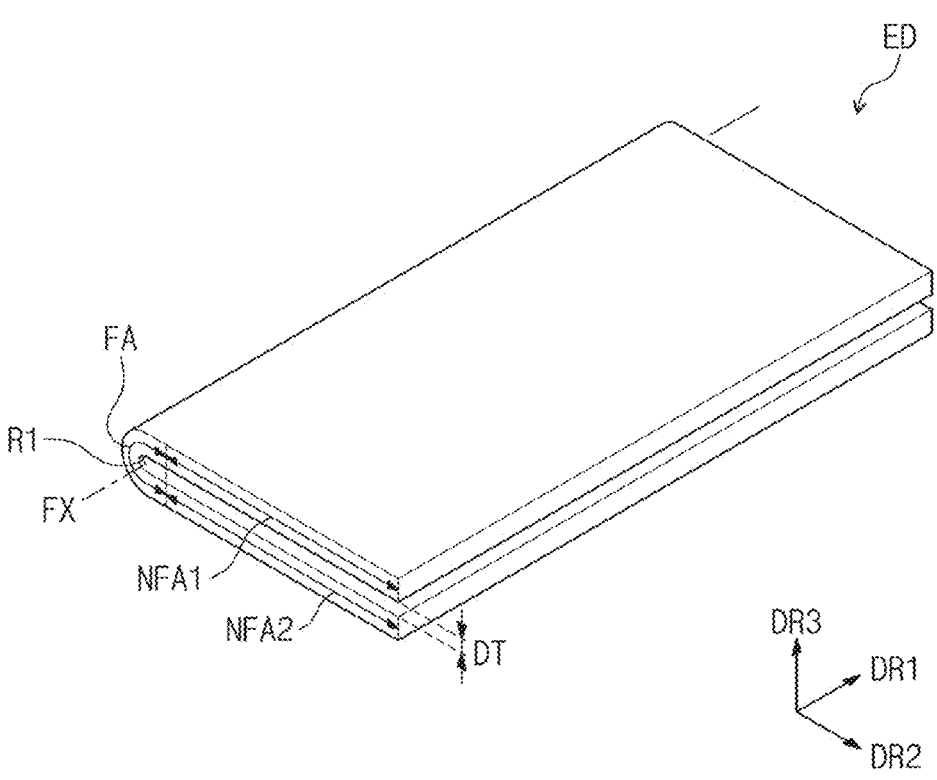
FIGS. 2A and 2B are perspective views of an embodiment of a folded display device according to the disclosure.
Figure 2B:
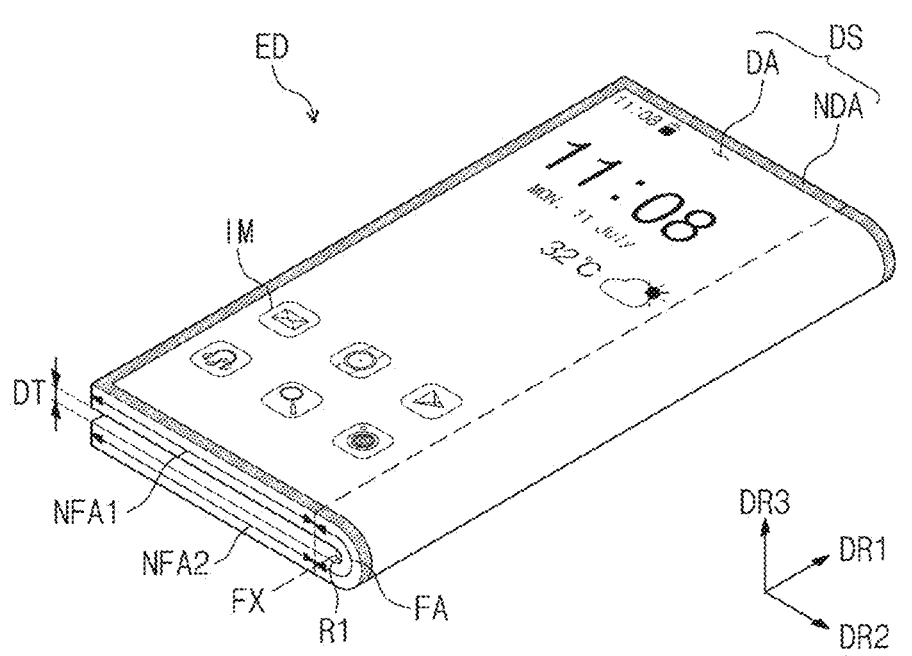

FIG. 1 is a perspective view of an embodiment of the display device ED according to the disclosure. FIGS. 2A and 2B are perspective views of an embodiment of a folded display device ED according to the disclosure.

The display device ED may be a device that is activated in response to an electrical signal and that displays an image IM. In an embodiment, the display device ED may be included in a small or medium-sized device, such as a monitor, a mobile phone, a tablet computer, a car navigation unit, a game machine, or the like, as well as a large-sized device, such as a television, a billboard, or the like, for example. However, the aforementioned embodiments of the display device ED are illustrative, and the display device ED is not limited to any one device as long as it does not deviate from the spirit and scope of the disclosure. In this embodiment, a mobile phone is illustrated as one of embodiments of the display device ED.

The display device ED in an embodiment may be a flexible display device. The term "flexible" used herein may refer to a property of being bent and may include everything from a structure that may be fully folded to a structure that may be bent to a level of several nanometers. In an embodiment, the flexible display device ED may include a slidable display device, a rollable display device, a curved display device, or a foldable display device. In this embodiment, a foldable display device is illustrated as one of embodiments of the flexible display device ED, for example.

FIG. 1 illustrates a perspective view of the display device ED in a flat state (or, an unfolded state). Referring to FIG. 1, the display device ED may have a quadrangular (e.g., rectangular) shape with sides extending in a first direction DR1 and a second direction DR2 in a plan view. However, without being limited thereto, the display device ED may have various shapes, such as a circular shape, a polygonal shape, or the like, in a plan view.

The display device ED in the flat state may display the image IM in a third direction DR3 on a display surface DS parallel to the first direction DR1 and the second direction DR2. The third direction DR3 may be a direction perpendicular to a plane defined by the first direction DR1 and the second direction DR2. A front surface (or, an upper surface) and a rear surface (or, a lower surface) of each of members constituting the display device ED may be opposite each other in the third direction DR3, and the normal directions of the front surface and the rear surface may be substantially parallel to the third direction DR3.

The separation distance between the front surface and the rear surface defined in the third direction DR3 may correspond to the thickness of the member. The expression "in a plan view" used herein may mean that it is viewed in the third direction DR3. The expression "in a cross-section"

used herein may mean that it is viewed in the first direction DR1 or the second direction DR2. The directions indicated by the first, second, and third directions DR1, DR2, and DR3 may be relative concepts and may be changed to different directions.

The display surface DS on which the image IM is displayed may correspond to a front surface of the display device ED. The image IM provided by the display device ED may include a still image as well as a dynamic image. In FIG. 1, a clock and icons are illustrated as embodiments of the image IM.

The display surface DS of the display device ED may include a display portion DA and a non-display portion NDA. The display portion DA may be a region of the display surface DS that displays the image IM. The display device ED may provide the image IM to a user through the display portion DA. The non-display portion NDA may be a region that does not display the image IM. The non-display portion NDA may have a predetermined color and may have a lower light transmittance than that of the display portion DA.

The non-display portion NDA may be adjacent to the display portion DA, and the shape of the display portion DA may be substantially defined by the non-display portion NDA. In an embodiment, the non-display portion NDA may surround the display portion DA in a plan view, for example. However, this is illustrative, and the non-display portion NDA may be disposed adjacent to only one side of the display portion DA, or may be disposed on a side surface rather than the front surface of the display device ED. In an embodiment, the non-display portion NDA may be omitted.

In an embodiment, the display device ED may sense an external input applied from the outside. The external input may include various forms of inputs provided from the outside of the display device ED. In an embodiment, the external input may include force, pressure, temperature, light, or the like, for example. The external input may include not only a touch input on the display device ED (e.g., a touch input by a hand of the user or a pen) but also an input (e.g., hovering) applied in proximity to the display device ED.

The display device ED may sense the external input applied to the front surface of the display device ED. However, a region of the display device ED where an external input is sensed is not limited to the front surface of the display device ED. In an embodiment, the display device ED may also sense an external input applied to the side surface or a rear surface of the display device ED, for example.

The display device ED may include a folding region FA and at least one non-folding region NFA1 or NFA2. In FIG. 1, the display device ED including a first non-folding region NFA1 and a second non-folding region NFA2 is illustrated as one of embodiments. The folding region FA may be disposed between the first non-folding region NFA1 and the second non-folding region NFA2. That is, in the flat state, the first non-folding region NFA1, the folding region FA, and the second non-folding region NFA2 of the display device ED may be arranged in the second direction DR2.

The folding region FA may be a region that is flat or folded with a predetermined curvature depending on a folding operation. As illustrated in FIG. 1, the folding region FA may be flat in the display device ED in the flat state. The first and second non-folding regions NFA1 and NFA2 may be regions that remain flat in folded and unfolded states.

The folding region FA of the display device ED may be folded about a folding axis extending in one direction. In an embodiment, as illustrated in FIGS. 2A and 2B, the display device ED may be folded about a folding axis FX extending in the first direction DR1, for example. The folding axis FX may extend in a direction parallel to long sides of the display device ED. However, without being limited thereto, the folding axis FX may extend in a direction parallel to short sides of the display device ED.

Referring to FIG. 2A, the folding axis FX may be defined over the front surface of the display device ED. The display surfaces DS (refer to FIG. 1) corresponding to the first and second non-folding regions NFA1 and NFA2 of the display device ED folded about the folding axis FX may face each other. The display device ED of FIG. 2A may be defined as the in-folded display device ED. In the in-folded display device ED, the rear surfaces of the display device ED that correspond to the first and second non-folding regions NFA1 and NFA2 may be opposite each other and may be exposed toward the outside. The display surface DS (refer to FIG. 1) corresponding to the folding region FA may be folded while forming a concavely curved surface.

Referring to FIG. 2B, the folding axis FX may be defined over the rear surface of the display device ED. The display surfaces DS corresponding to the first and second non-folding regions NFA1 and NFA2 of the display device ED folded about the folding axis FX may be opposite each other and may be exposed to the outside. The display device ED of FIG. 2B may be defined as the out-folded display device ED. In the out-folded display device ED, the rear surfaces of the display device ED that correspond to the first and second non-folding regions NFA1 and NFA2 may face each other. The display surface DS corresponding to the folding region FA may be folded while forming a convexly curved surface. As the display surface DS of the out-folded display device ED is exposed to the outside, the user may visually recognize the image IM even in the folded state.

Referring to FIGS. 2A and 2B, the folding region FA may be folded with a predetermined curvature and may have a radius of curvature R1. The distance DT between the first and second non-folding regions NFA1 and NFA2 may be substantially the same as twice the radius of curvature R1. However, without being limited thereto, the distance DT between the first and second non-folding regions NFA1 and NFA2 may be smaller than twice the radius of curvature R1. Accordingly, the folding region FA of an embodiment may be folded in a dumbbell shape when viewed in the first direction DR1.

The display device ED in an embodiment may be folded about the one folding axis FX by only one method selected from in-folding and out-folding. However, without being limited thereto, the display device ED may operate such that in-folding and out-folding are mutually repeated. In this embodiment, the display device ED is illustrated as being folded about the one folding axis FX. However, the number of folding axes FX defined in the display device ED is not limited thereto, and the display device ED may be folded about a plurality of folding axes and may include a plurality of folding regions spaced apart from each other.

Figure 3:
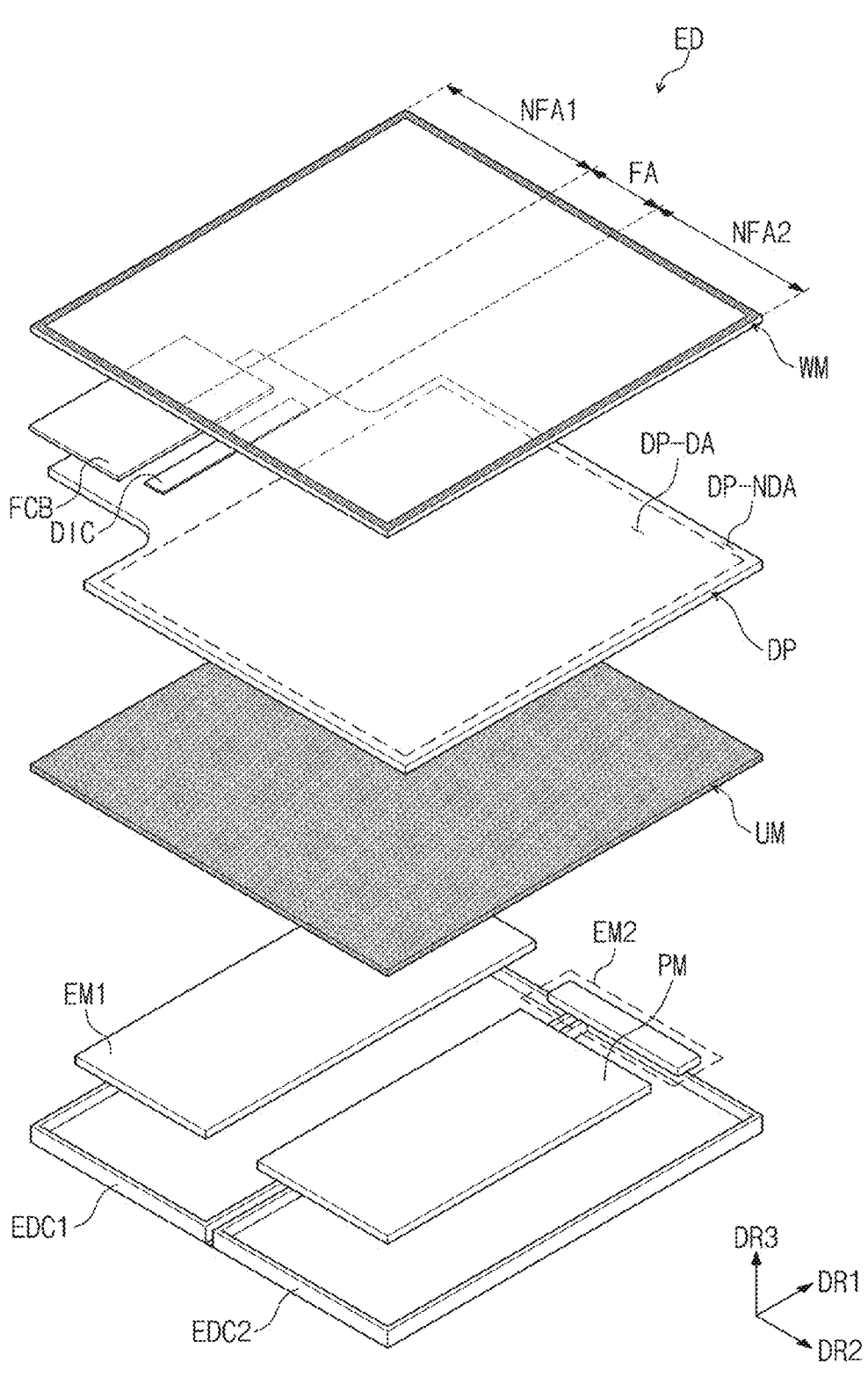
FIG. 3 is an exploded perspective view of an embodiment of a display device according to the disclosure.

FIG. 3 is an exploded perspective view of an embodiment of a display device ED according to the disclosure.

Referring to FIG. 3, the display device ED may include a window module WM, a display panel DP, a lower module UM, a first electronic module EM1, a second electronic module EM2, a power supply module PM, and cases EDC1 and EDC2. The display device ED may further include a mechanical structure (e.g., a hinge) for controlling a folding operation of the window module WM, the display panel DP, and the lower module UM.

The window module WM may provide the front surface of the display device ED. That is, a front surface of the window module WM may correspond to the front surface of the display device ED. The window module WM may transmit light generated from the display panel DP, and the user may visually recognize the image IM (refer to FIG. 1) on the window module WM.

The window module WM may include a plurality of layers for protecting the display panel DP. The window module WM may absorb an external impact applied to the display panel DP, or may protect the display panel DP from scratches. Detailed description about the layers included in the window module WM will be given below.

The display panel DP may generate the image IM (refer to FIG. 1) in response to an electrical signal. The display panel DP in an embodiment may be an emissive display panel, but is not particularly limited thereto. In an embodiment, the display panel DP may be an organic light-emitting display panel, an inorganic light-emitting display panel, or a quantum-dot light-emitting display panel, for example. An emissive layer of the organic light-emitting display panel may include an organic light-emitting material, and an emissive layer of the inorganic light-emitting display panel may include an inorganic light-emitting material. An emissive layer of the quantum-dot light-emitting display panel may include quantum dots and quantum rods. Hereinafter, the display panel DP is an organic light-emitting display panel in the illustrated embodiment.

In FIG. 3, only the display panel DP is illustrated as a component disposed under the window module WM. However, the display device ED may further include components disposed above or under the display panel DP. In an embodiment, the display device ED may further include an input sensor stacked on the top or bottom of the display panel DP, for example. The input sensor may sense an external input applied from the outside of the display device ED and may obtain coordinate information of the external input. The input sensor may be driven by various methods, such as a capacitive detecting method, a resistive detecting method, an infrared detecting method, and a pressure detecting method, but is not limited to any one method.

The display panel DP may include a display region DP-DA that displays the image IM (refer to FIG. 1) and a non-display region DP-NDA on which an image is not displayed. The display region DP-DA may correspond to the display portion DA (refer to FIG. 1) of the display device ED, and the non-display region DP-NDA may correspond to the non-display portion NDA (refer to FIG. 1) of the display device ED. The expression "a region/portion corresponds to a region/portion" used herein means that "the regions/portions overlap each other", but is not limited to having the same area and/or the same shape.

The display panel DP may include a data driver DIC disposed on the non-display region DP-NDA. The data driver DIC may include a data drive circuit for driving pixels of the display panel DP. The data driver DIC may be manufactured in the form of an integrated circuit chip and may be disposed (e.g., mounted) on the non-display region DP-NDA of the display panel DP.

The display device ED may further include a circuit board FCB electrically connected to the display panel DP on the non-display region DP-NDA. In FIG. 3, the data driver DIC disposed on the display panel DP is illustrated in an embodiment. However, without being limited thereto, the data driver DIC may be disposed (e.g., mounted) on the circuit board FCB.

The lower module UM may be disposed under the display panel DP. The lower module UM may protect the display panel DP by absorbing an external impact applied toward a rear surface of the display panel DP. Furthermore, the lower module UM may improve an impact resistance of the flexible display panel DP.

The lower module UM may overlap the folding region FA, the first non-folding region NFA1, and the second non-folding region NFA2. The lower module UM may be folded together as the display panel DP and the window module WM are folded. The lower module UM may have flexibility to correspond to the folding region FA and may have stiffness to correspond to the first non-folding region NFA1 and the second non-folding region NFA2. The lower module UM may include various embodiments as long as the lower module UM is capable of being folded while protecting the bottom of the display panel DP.

The power supply module PM, the first electronic module EM1, and the second electronic module EM2 may be disposed under the lower module UM. The power supply module PM and the first and second electronic modules EM1 and EM2 may be connected with each other through a separate flexible circuit board.

The power supply module PM may supply power desired for overall operation of the display device ED. The power supply module PM may include a conventional battery module.

The first electronic module EM1 and the second electronic module EM2 may include various functional modules for operating the display device ED. The first electronic module EM1 and the second electronic module EM2 may be directly disposed (e.g., mounted) on a mother board electrically connected with the display panel DP, or may be disposed (e.g., mounted) on separate substrates and may be electrically connected to the mother board through connectors.

The first electronic module EM1 may include a control module, a wireless communication module, an image input module, a sound input module, a sound output module, a memory, and an external interface module.

The second electronic module EM2 may include a camera module, a proximity sensor, a biosensor for recognizing a part of the user's body (e.g., a fingerprint, an iris, or a face), or a lamp for outputting light. In an embodiment, the second electronic module EM2 may receive or output an optical signal through a portion of the display region DP-DA of the display panel DP. However, without being limited thereto, the second electronic module EM2 may receive or output an optical signal through a portion of the non-display region DP-NDA.

The window module WM and the cases EDC1 and EDC2 may be coupled with each other to form the exterior of the display device ED and may provide an inner space in which components of the display device ED are accommodated. In an embodiment, the cases EDC1 and EDC2 may accommodate the display panel DP, the first and second electronic modules EM1 and EM2, and the power supply module PM and may protect the accommodated the components of the display device ED, for example.

Figure 4:
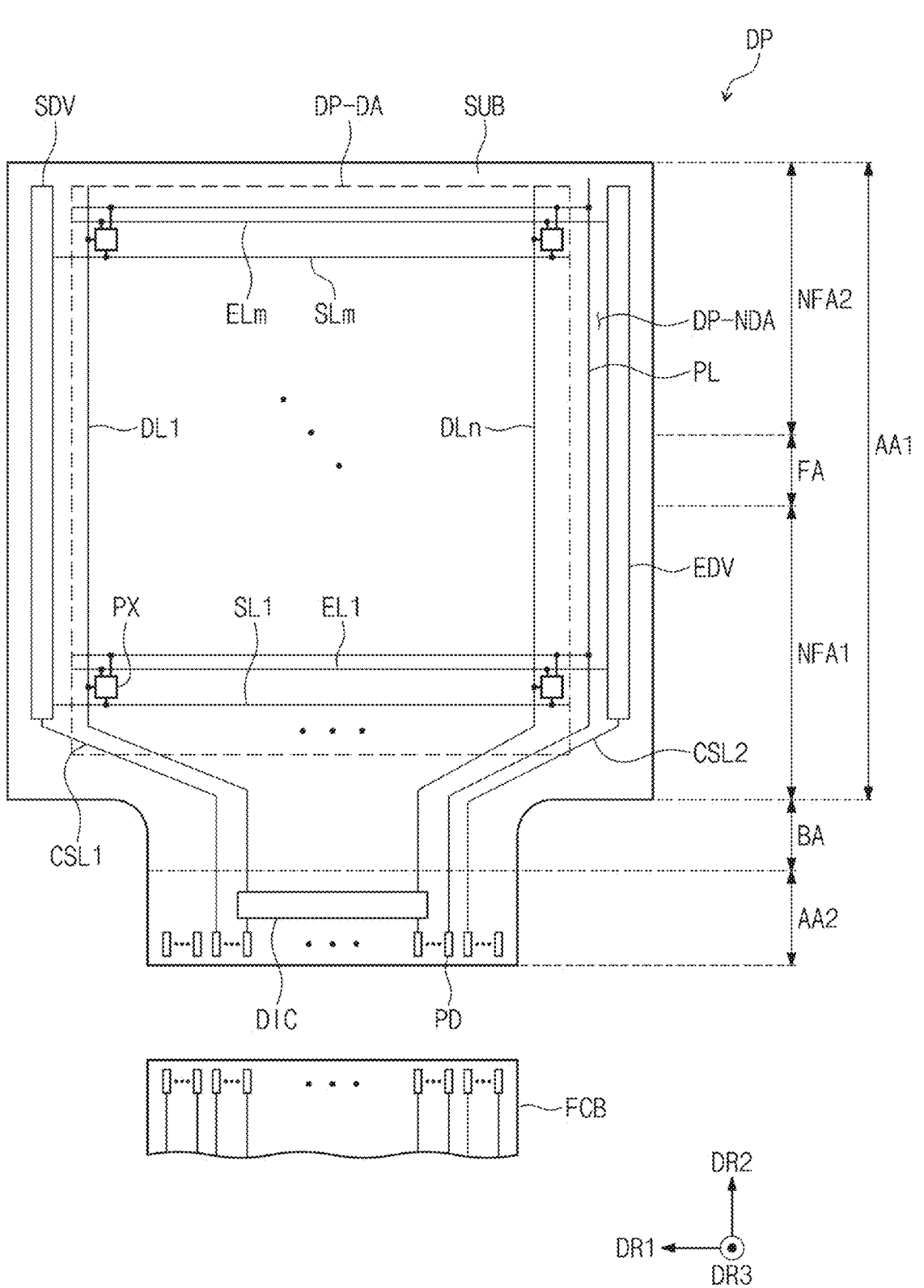
FIG. 4 is a plan view of an embodiment of a display panel according to the disclosure.

FIG. 4 is a plan view of an embodiment of a display panel DP according to the disclosure.

Referring to FIG. 4, the display panel DP may include a base substrate SUB, pixels PX, signal lines SL1 to SLm, EL1 to ELm, DL1 to DLn, CSL1, CSL2, and PL electrically connected to the pixels PX, a scan driver SDV, a data driver DIC, an emission driver EDV, and pads PD. The signal lines SL1 to SLm, EL1 to ELm, DL1 to DLn, CSL1, CSL2, and PL may include scan lines SL1 to SLm, data lines DL1 to DLn, emission lines EL1 to ELm, first and second control lines CSL1 and CSL2, and a power line PL. Here, "m" and "n" are natural numbers.

The base substrate SUB may provide a base surface on which elements and lines of the display panel DP are disposed. The base substrate SUB may include a display region DP-DA and a non-display region DP-NDA. The display region DP-DA may be a region where an image is displayed by the pixels PX, and the non-display region DP-NDA may be a region that is disposed adjacent to the display region DP-DA and on which elements or lines for driving the pixels PX are disposed.

The base substrate SUB may be a flexible substrate. The base substrate SUB may include a first panel region AA1, a second panel region AA2, and a bending region BA. The bending region BA may be disposed between the first panel region AA1 and the second panel region AA2, and the first panel region AA1, the bending region BA, and the second panel region AA2 may be arranged in the second direction DR2. However, the shape of the base substrate SUB in a plan view is not limited to that illustrated in the drawing and may be diversely changed depending on a structure of the display device ED (refer to FIG. 1).

The first panel region AA1 may include the display region DP-DA. The remaining first panel region AA1 other than the display region DP-DA, the bending region BA, and the second panel region AA2 may correspond to the non-display region DP-NDA.

The first panel region AA1 may include a first non-folding region NFA1, a folding region FA, and a second non-folding region NFA2. As the display device ED (refer to FIG. 1) is folded, the first panel region AA1 of the display panel DP may be folded about the folding axis.

The bending region BA may be a region that is bent with a predetermined curvature as the display panel DP is accommodated in the cases EDC1 and EDC2 (refer to FIG. 3). The bending region BA may be bent about a bending axis extending in the first direction DR1 such that the second panel region AA2 faces toward a rear surface of the first panel region AA1. The first panel region AA1 and the second panel region AA2 may overlap each other in a plan view by the bending of the bending region BA. The bending region BA may have a smaller width in the first direction DR1 than that of the first panel region AA1, and thus the bending region BA may be easily bent. However, the disclosure is not necessarily limited thereto.

Each of the pixels PX may include a pixel drive circuit constituted by transistors (e.g., a switching transistor and a drive transistor) and a capacitor and a light-emitting element connected to the pixel drive circuit. The pixels PX may emit light in response to an electrical signal applied thereto.

The scan driver SDV, the data driver DIC, and the emission driver EDV may be disposed on the non-display region DP-NDA. In an embodiment, the scan driver SDV and the emission driver EDV may be disposed on the first panel region AA1, and the data driver DIC may be disposed on the second panel region AA2. However, the disclosure is not limited thereto. In an embodiment, at least one of the scan driver SDV, the data driver DIC, and the emission driver EDV may overlap the display region DP-DA, and thus the area of the non-display region DP-NDA of the display panel DP may be decreased.

Each of the pixels PX may be connected to a corresponding one of the scan lines SL1 to SLm, a corresponding one of the data lines DL1 to DLn, and a corresponding one of the emission lines EL1 to ELm. More types of signal lines may be included in the display panel DP depending on the configuration of the pixel drive circuits of the pixels PX.

The scan lines SL1 to SLm may extend in the first direction DR1 and may be connected to the scan driver SDV. The data lines DL1 to DLn may extend in the second direction DR2 and may be connected to the data driver DIC. The emission lines EL1 to ELm may extend in the first direction DR1 and may be connected to the emission driver EDV.

The power line PL may include a portion extending in the first direction DR1 and a portion extending in the second portion DR2. The portion of the power line PL that extends in the first direction DR1 and the portion of the power line PL that extends in the second portion DR2 may be disposed in different layers. However, without being limited thereto, the portion of the power line PL that extends in the first direction DR1 and the portion of the power line PL that extends in the second portion DR2 may be unitary in the same layer. The portion of the power line PL that extends in the second direction DR2 may extend from the first panel region AA1 to the second panel region AA2 via the bending region BA. The power line PL may receive a drive voltage and may provide the drive voltage to the pixels PX.

The first control line CSL1 may be connected to the scan driver SDV and may extend toward a lower end of the second panel region AA2 via the bending region BA. The second control line CSL2 may be connected to the emission driver EDV and may extend toward the lower end of the second panel region AA2 via the bending region BA.

The pads PD may be disposed adjacent to the lower end of the second panel region AA2. The pads PD may be disposed closer to a lower end of the display panel DP than the data driver DIC is to the lower end of the display panel DP. The pads PD may be arranged in the first direction DR1. The pads PD may be portions connected to the circuit board FCB.

The circuit board FCB may include a timing controller for controlling operations of the scan driver SDV, the data driver DIC, and the emission driver EDV and a voltage generator for generating a voltage. The circuit board FCB may be electrically connected to the pads PD and may transmit an electrical signal to the display panel DP through the pads PD.

Each of the pads PD may be connected to a corresponding signal line. In an embodiment, the power line PL and the first and second control lines CSL1 and CSL2 may be connected to corresponding pads PD, for example. The data lines DL1 to DLn may be connected to corresponding pads PD through the data driver DIC.

The scan driver SDV may generate scan signals in response to a scan control signal. The scan signals may be applied to the pixels PX through the scan lines SL1 to SLm. The data driver DIC may generate data voltages corresponding to image signals in response to a data control signal. The data voltages may be applied to the pixels PX through the data lines DL1 to DLn. The emission driver EDV may generate emission signals in response to an emission control signal. The emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. Light emission time of the pixels PX may be controlled by the emission signals. Accordingly, the display panel DP may output the image through the display region DP-DA by the pixels PX.

Figure 5:
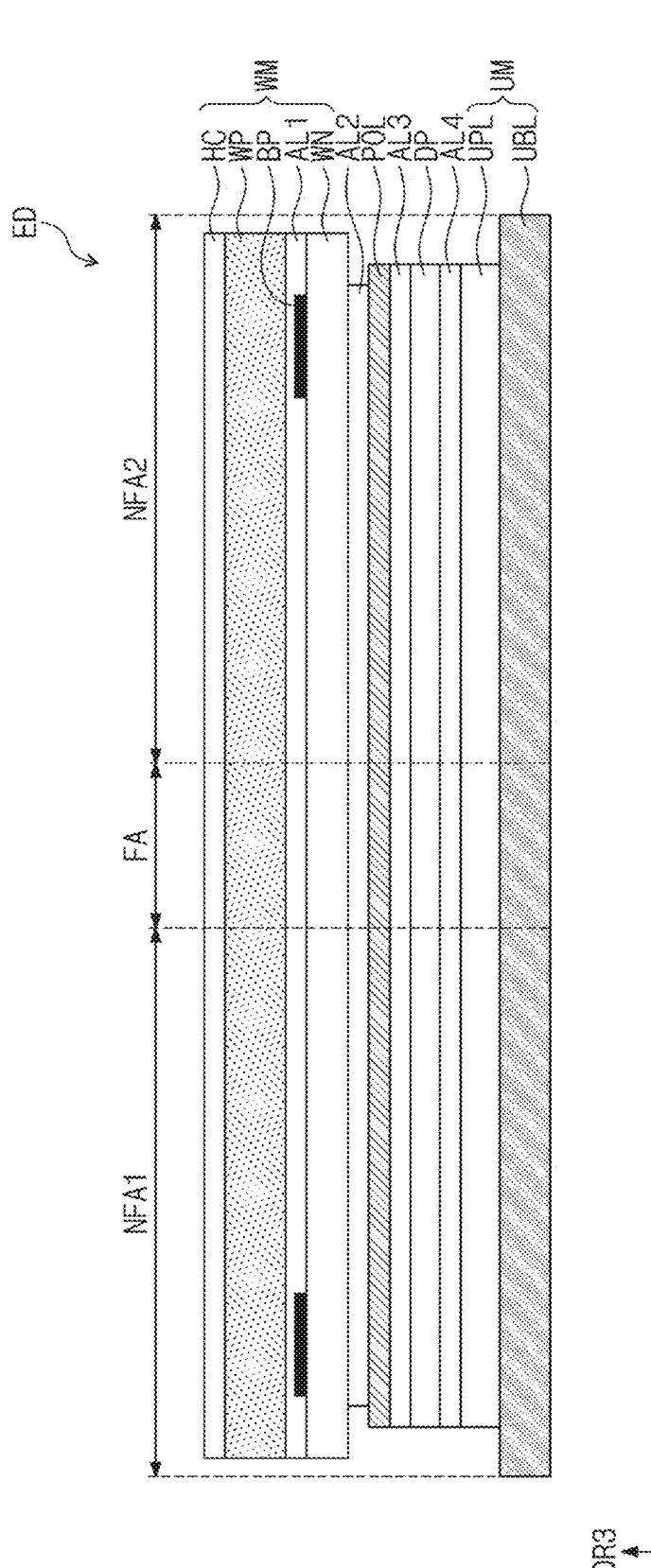
FIG. 5 is a cross-sectional view of an embodiment of a display device according to the disclosure.
Figure 5:
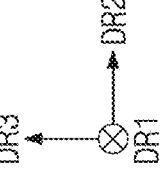

FIG. 5 is a cross-sectional view of an embodiment of a display device ED according to the disclosure. The above descriptions may be applied to components of the display device ED of FIG. 5.

Referring to FIG. 5, the display device ED may include the window module WM, an anti-reflector POL, the display panel DP, and the lower module UM. The display device ED may include adhesive layers AL1, AL2, AL3, and AL4 that couple the components of the display device ED.

The window module WM may be disposed on the display panel DP and the anti-reflector POL and may protect the display panel DP and the anti-reflector POL. The window module WM may be folded with a curvature to correspond to the folding region FA. The window module WM may include a base film WN, the first adhesive layer AL1, a window protection layer WP, a bezel pattern BP, and a functional coating layer HC.

The base film WN may be a support film on which the window protection layer WP and the functional coating layer HC are disposed. Among the components of the window module WM, the base film WN may be disposed adjacent to the display panel DP in the thickness direction (e.g., the third direction DR3).

The base film WN may include an optically clear material. In an embodiment, the base film WN may include a glass film or a synthetic resin film, for example. The synthetic resin film of the base film WN may include polyimide ("PI"), polyethyleneterephthalate ("PET"), polyacrylate, polymethylmethacrylate ("PMMA"), polycarbonate ("PC"), polyethylenenaphthalate ("PEN"), or any combinations thereof. However, the material of the base film WN is not limited to the aforementioned embodiments.

The window protection layer WP may be disposed on the base film WN. The window protection layer WP may have a multi-layer structure. In an embodiment, the window protection layer WP may include an impact absorbing layer, an impact transmitting layer, and a barrier layer sequentially stacked on the base film WN, for example. The window protection layer WP may simultaneously improve the durability and impact resistance of the window module WM without deteriorating the folding characteristics of the window module WM. The components of the window protection layer WP will be described below in detail with reference to drawings.

The window protection layer WP may have a relatively high light transmittance. In an embodiment, the window protection layer WP may have a light transmittance of about 80% or more in a wavelength region of about 380 nanometer (nm) to about 780 nm that is a visible light region, for example. Furthermore, the window protection layer WP may have relatively excellent optical characteristics. In an embodiment, the window protection layer WP may have a haze of about 3% or less, for example. Accordingly, window protection layer WP may sufficiently transmit light provided by the display panel DP and may improve the display quality of the display device ED.

The functional coating layer HC may be disposed on the window protection layer WP. The functional coating layer HC may be disposed at the top of the window module WM. The functional coating layer HC may be formed on an upper surface of the window protection layer WP by coating. Without being limited thereto, the functional coating layer HC may be coupled to the upper surface of the window protection layer WP through an adhesive.

The functional coating layer HC may include at least one layer. In an embodiment, the functional coating layer HC may have the function of a hard coating layer, an anti-fingerprint layer, an antistatic layer, or an anti-contamination layer, for example.

The functional coating layer HC may include a hard coating agent that includes at least one of an organic composition, an inorganic composition, and an organic-inorganic composite composition and may function as the hard coating layer. In an embodiment, the functional coating layer HC may include an acrylate-based compound, an epoxy-based compound, a siloxane-based compound, or a urethane-based compound, for example. Accordingly, the functional coating layer HC may supplement the durability of the window module WM, may prevent scratches, and may provide a flat upper surface. The functional coating layer HC may include an anti-fingerprint coating agent such as a fluorine-containing compound and may function as the anti-fingerprint layer.

In some embodiments, the functional coating layer HC may simultaneously perform a hard coating function and an anti-fingerprint function. The functional coating layer HC may have a single-layer structure including both the hard coating agent and the anti-fingerprint coating agent, or may have a multi-layer structure in which the hard coating layer and the anti-fingerprint layer are stacked on each other. Without being limited thereto, the functional coating layer HC may further include an anti-reflection agent or an anti-glare agent.

The bezel pattern BP may be disposed inside the window module WM. In an embodiment, the bezel pattern BP may be disposed on one surface of the base film WN, for example. However, without being limited thereto, the bezel pattern BP may be disposed on a lower surface of the window protection layer WP. The bezel pattern BP may be formed by a method such as coating or printing. The bezel pattern BP may include a colored light-blocking film including a pigment or a dye. Accordingly, components of the display panel DP disposed to overlap the bezel pattern BP may be prevented from being visible from the outside. The region where the bezel pattern BP is disposed may correspond to the non-display portion NDA (refer to FIG. 1) of the display device ED.

The first adhesive layer AL1 may be disposed between the base film WN and the window protection layer WP and may couple the base film WN and the window protection layer WP. The first adhesive layer AL1 may include an optically clear adhesive. In an embodiment, the first adhesive layer AL1 may include a pressure sensitive adhesive ("PSA") film, an optically clear adhesive ("OCA") film, or an optically clear resin ("OCR"), for example.

The anti-reflector POL may be disposed between the window module WM and the display panel DP. The anti-reflector POL may be coupled with the window module WM through the second adhesive layer AL2. The anti-reflector POL may decrease the reflectivity of external light incident toward the display panel DP from the outside. The anti-reflector POL may include various embodiments capable of decreasing the reflectivity of external light.

In an embodiment, the anti-reflector POL may include a polarizer film. The polarizer film may include a phase retarder and/or a polarizer. The phase retarder may include a $\lambda/2$ phase retarder and/or a $\lambda/4$ phase retarder. The phase retarder and the polarizer may each be provided in a film type or a liquid crystal coating type. The film type polarizer may include a stretchable synthetic resin film, and the liquid crystal coating type polarizer may include liquid crystals arranged in a predetermined arrangement. In an embodiment, the phase retarder and the polarizer may be implemented with one polarizer film.

In an embodiment, the anti-reflector POL may include color filters having a predetermined arrangement. In an embodiment, the color filters may be disposed to correspond to light emission colors of the pixels PX (refer to FIG. 3) included in the display panel DP, for example. The anti-reflector POL may filter external light incident from the outside of the display device ED into colors corresponding to the light emission colors of the pixels. The anti-reflector POL may further include a black matrix adjacent to the color filters.

The anti-reflector POL may be coupled with the display panel DP by the third adhesive layer AL3 disposed between the display panel DP and the anti-reflector POL. However, without being limited thereto, the third adhesive layer AL3 may be omitted, and the anti-reflector POL may be directly disposed on the display panel DP.

The lower module UM may be disposed on the rear surface of the display panel DP. The lower module UM may be coupled with the display panel DP through the fourth adhesive layer AL4. However, without being limited thereto, the fourth adhesive layer AL4 may be omitted, and the lower module UM may be directly disposed on the rear surface of the display panel DP.

The above-described second to fourth adhesive layers AL2, AL3, and AL4 may include an optically clear adhesive. In an embodiment, the second to fourth adhesive layers AL2, AL3, and AL4 may include a pressure sensitive adhesive film, an optically clear adhesive film, or an optically clear resin, for example.

The lower module UM may include a lower protective layer UPL and a lower plate layer UBL that are disposed on the rear surface of the display panel DP. The lower plate layer UBL may be disposed under the lower protective layer UPL. The lower protective layer UPL may be disposed on the rear surface of the display panel DP and may protect the display panel DP from an external impact applied to the bottom of the display panel DP. Furthermore, the lower protective layer UPL may prevent a scratch on the rear surface of the display panel DP in a process of manufacturing the display panel DP. The lower protective layer UPL may include at least one of a synthetic resin layer or a cushion layer that protect the display panel DP.

The synthetic resin layer of the lower protective layer UPL may include at least one of polyamide or polyethyleneterephthalate. However, the material of the synthetic resin layer of the lower protective layer UPL is not limited to the aforementioned embodiments.

The lower protective layer UPL may include the cushion layer having a porous structure. In an embodiment, the cushion layer of the lower protective layer UPL may include synthetic resin foam, for example. The synthetic resin foam may include acrylonitrile butadiene styrene copolymer ("ABS") foam, polyurethane ("PU") foam, polyethylene ("PE") foam, ethylene vinyl acetate ("EVA") foam, or polyvinyl chloride ("PVC") foam. However, the material of the cushion layer of the lower protective layer UPL is not limited to the aforementioned embodiments.

The lower plate layer UBL may include a material having stiffness. The lower plate layer UBL may include a material having relatively high resistance to a compressive force such as external pressure. In an embodiment, the lower plate layer UBL may include a metallic material such as stainless steel, or may include a fiber reinforced composite such as carbon fiber reinforced plastic ("CFRP") or glass fiber reinforced plastic ("GFRP"), for example. The lower plate layer UBL may support the display panel DP and may prevent a crease in the display panel DP due to repeated folding and unfolding operations.

The magnitude of stiffness of the lower plate layer UBL may vary depending on regions in which the lower plate layer UBL is disposed. In an embodiment, one portion of the lower plate layer UBL corresponding to the folding region FA may have a lower stiffness than other portions of the lower plate layer UBL corresponding to the non-folding regions NFA1 and NFA2, for example. The one portion of the lower plate layer UBL corresponding to the folding region FA may include a flexible material, may have an opening defined therein, or may have a smaller thickness than the other portions of the lower plate layer UBL corresponding to the non-folding regions NFA1 and NFA2. Accordingly, the lower plate layer UBL may be easily folded to correspond to the folding region FA.

The stacked components of the display device ED illustrated in FIG. 5 are illustrative, and additional components may be further disposed in the display device ED. In an embodiment, an input sensor may be additionally disposed between the display panel DP and the anti-reflector POL, or layers such as a heat radiating layer, a light-blocking layer, a digitizer, or a step compensation layer may be additionally disposed under the lower module UM. However, without being limited thereto, the stacking sequence of some of the components of the display device ED illustrated in FIG. 5 may be changed, or the some of the components may be omitted, for example.

Figure 6A:
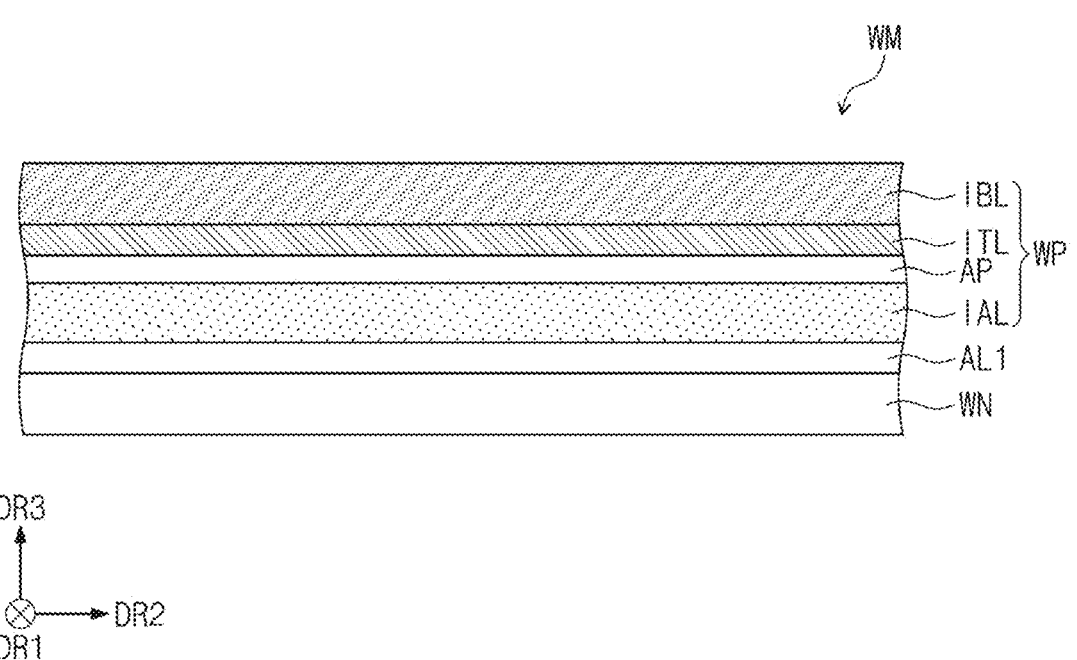
FIGS. 6A and 6B are cross-sectional views of an embodiment of a window module in embodiments of the disclosure.
Figure 6B:
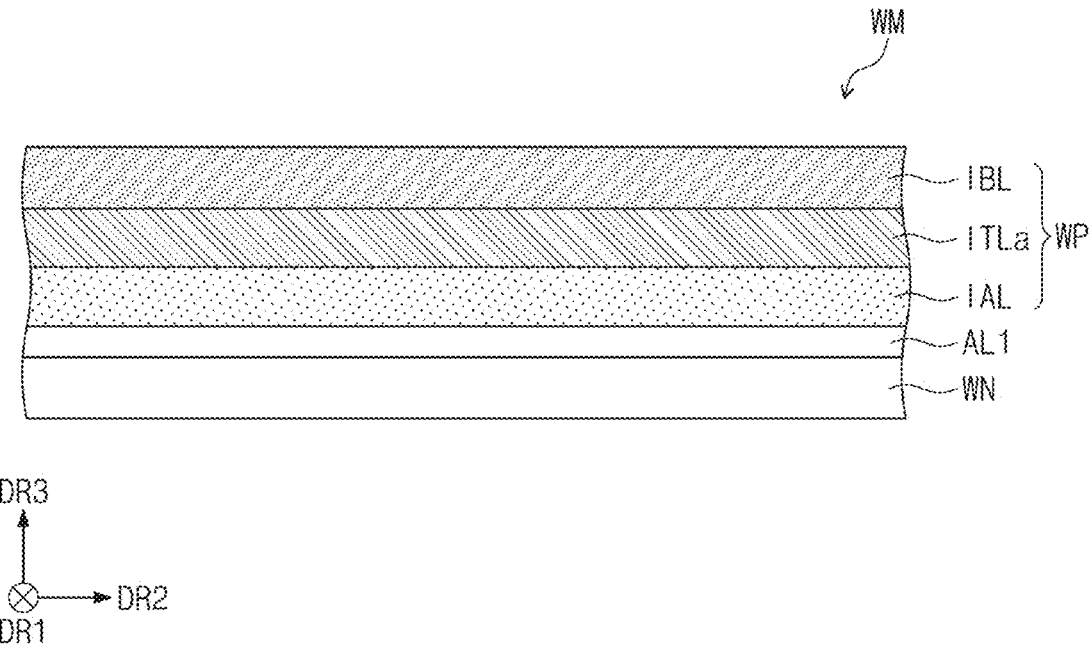

FIGS. 6A and 6B are cross-sectional views of an embodiment of a window module WM according to the disclosure.

Referring to FIGS. 6A and 6B, the window module WM may include the base film WN, the first adhesive layer ALL and the window protection layer WP. The above description may be applied to the components of the window module WM illustrated in FIGS. 6A and 6B.

Referring to FIG. 6A, the window protection layer WP may include an impact absorbing layer IAL, an adhesive part AP, an impact transmitting layer ITL, and a barrier layer IBL that are disposed on the base film WN. The impact absorbing layer IAL, the adhesive part AP, the impact transmitting layer ITL, and the barrier layer IBL may be sequentially disposed on an upper surface of the base film WN in the third direction DR3. That is, the barrier layer IBL may correspond to the upper surface of the window protection layer WP, and the barrier layer IBL, the impact transmitting layer ITL, the adhesive part AP, and the impact absorbing layer IAL may sequentially disposed toward the base film WN in the thickness direction.

Among the components of the window protection layer WP, the barrier layer IBL may be disposed in the uppermost position. The barrier layer IBL may include a rigid film having a relatively high modulus. In an embodiment, the barrier layer IBL may include polyimide ("PI"), polyethyleneterephthalate ("PET"), polycarbonate ("PC"), polymethylmethacrylate ("PMMA"), or any combinations thereof, for example.

The barrier layer IBL may have a modulus of 2 gigapascals (GPa) to 8 gigapascals (GPa) at a temperature of −20 degrees Celsius to 85 degrees Celsius. Accordingly, the barrier layer IBL may improve the durability and impact resistance of the window module WM and may allow the window module WM to have a relatively high surface hardness. In a case in which the barrier layer IBL has a modulus of less than 2 GPa or a modulus of more than 8 GPa, the window protection layer WP may fail to have sufficient durability and impact resistance, folding and unfolding operations thereof may not be easy, and the window protection layer WP may be separated or cracked by folding and unfolding.

The impact absorbing layer IAL may be disposed between the base film WN and the barrier layer IBL. The impact absorbing layer IAL may be disposed adjacent to the base film WN. The impact absorbing layer IAL may include a soft film having a lower modulus than that of the barrier layer IBL. In an embodiment, the impact absorbing layer IAL may include thermoplastic polyurethane ("TPU"), thermoset polyurethane ("TSU"), polyether block amide ("PEBA"), copolyester thermoplastic elastomer ("COPE"), silicone, or any combinations thereof, for example.

The impact absorbing layer IAL may have a modulus of 300 megapascals (MPa) to 1.5 gigapascals (GPa) at a temperature of –20 degrees Celsius to 85 degrees Celsius. Accordingly, the impact absorbing layer IAL may disperse and absorb an external impact applied to the window protection layer WP. In a case in which the impact absorbing layer IAL has a modulus of less than 300 MPa or a modulus of more than 1.5 GPa, the impact absorbing layer IAL may have a crease due to folding and unfolding operations, or may not sufficiently absorb an external impact.

The impact transmitting layer ITL may be disposed between the barrier layer IBL and the impact absorbing layer IAL. In an embodiment, the impact transmitting layer ITL may contact a rear surface of the barrier layer IBL. The impact transmitting layer ITL may be formed on the rear surface of the barrier layer IBL through deposition. However, without being limited thereto, the impact transmitting layer ITL may be formed on an upper surface of the impact absorbing layer IAL through deposition.

The impact transmitting layer ITL may have a relatively small thickness so as not to deteriorate the folding characteristics of the window protection layer WP. In an embodiment, the impact transmitting layer ITL may have a thickness of 0.1 nanometer (nm) to 5 micrometers (μm), for example. In a case in which the impact transmitting layer ITL has a thickness of less than 0.1 nanometer (nm), an impact transmission effect may not be sufficient. In a case in which the impact transmitting layer ITL has a thickness of more than 5 micrometers (μm), the folding characteristics of the window protection layer WP may be deteriorated. Furthermore, in the case in which the impact transmitting layer ITL has a thickness of more than 5 micrometers (μm), the light transmittance of the window protection layer WP may be decreased.

The impact transmitting layer ITL may include graphene or carbon nanotubes. The speed of sound in a material may be proportional to the speed at which kinetic energy propagates within the material, and the speed of sound within the graphene may be about 20 kilometers per second (km/s) or more. Since the impact transmitting layer ITL includes the graphene or the carbon nanotubes that rapidly propagate kinetic energy, the impact transmitting layer ITL may rapidly horizontally transmit an external impact vertically transmitted through the barrier layer IBL.

The adhesive part AP may be disposed between the barrier layer IBL having the impact transmitting layer ITL formed on the rear surface thereof and the impact absorbing layer IAL and may couple the barrier layer IBL and the impact absorbing layer IAL. That is, the adhesive part AP may contact the impact transmitting layer ITL and the impact absorbing layer IAL. The adhesive part AP may include an optically clear adhesive. In an embodiment, the adhesive part AP may include a pressure sensitive adhesive film, an optically clear adhesive film, or an optically clear resin, for example.

However, the disclosure is not limited thereto, and the impact transmitting layer ITL and the adhesive part AP may be implemented as a single layer. Referring to FIG. 6B, an impact transmitting layer ITLa may include an adhesive resin having an adhesive force. The impact transmitting layer ITLa may include graphene or carbon nanotubes dispersed in the adhesive resin. The impact transmitting layer ITLa may contact the barrier layer IBL and the impact absorbing layer IAL. The impact transmitting layer ITLa including the adhesive resin may couple the barrier layer IBL and the impact absorbing layer IAL. The rear surface of the barrier layer IBL or the upper surface of the impact absorbing layer IAL may be coated with the adhesive resin having the graphene or the carbon nanotubes dispersed therein, and thus the impact transmitting layer ITLa may be formed. Accordingly, the impact transmitting layer ITLa may be provided as a single layer and may have a function of coupling the barrier layer IBL and the impact absorbing layer IAL and a function of horizontally transmitting an external impact.

To minimize stress accumulated in components by repeated folding and unfolding operations of the display device ED (refer to FIG. 5), the components of the display device ED (refer to FIG. 5) may be formed to have a relatively small thickness. Accordingly, the window module WM disposed on the display panel DP (refer to FIG. 5) may also be formed to have a relatively small thickness. However, as the thickness of the window module WM is decreased, the durability and impact resistance of the window module WM may be deteriorated. Due to this, the display panel DP (refer to FIG. 5) may have a defect, such as a bright spot or a dark spot, when an external impact is applied from above the display device ED (refer to FIG. 5).

However, since the window protection layer WP includes the impact transmitting layer ITL, the impact transmitting layer ITL may transmit the external impact in horizontal directions corresponding to the first direction DR1 and the second direction DR2, and the impact absorbing layer IAL may disperse and absorb the external impact transmitted in the horizontal directions, thereby increasing the impact absorbing and alleviating effects of the window protection layer WP. Accordingly, the impact resistance of the window protection layer WP may be improved. In addition, since the window protection layer WP includes the impact transmitting layer ITL, the adhesive part AP or the first adhesive layer AL1 may be prevented from being pressed or pushed at the point where the external impact is applied.

FIGS. 7A to 7D are cross-sectional views of an embodiment of a window module WM according to the disclosure. The above description may be applied to components of the window module WM illustrated in FIGS. 7A to 7D, and the following description will be focused on differences.

Figure 7A:
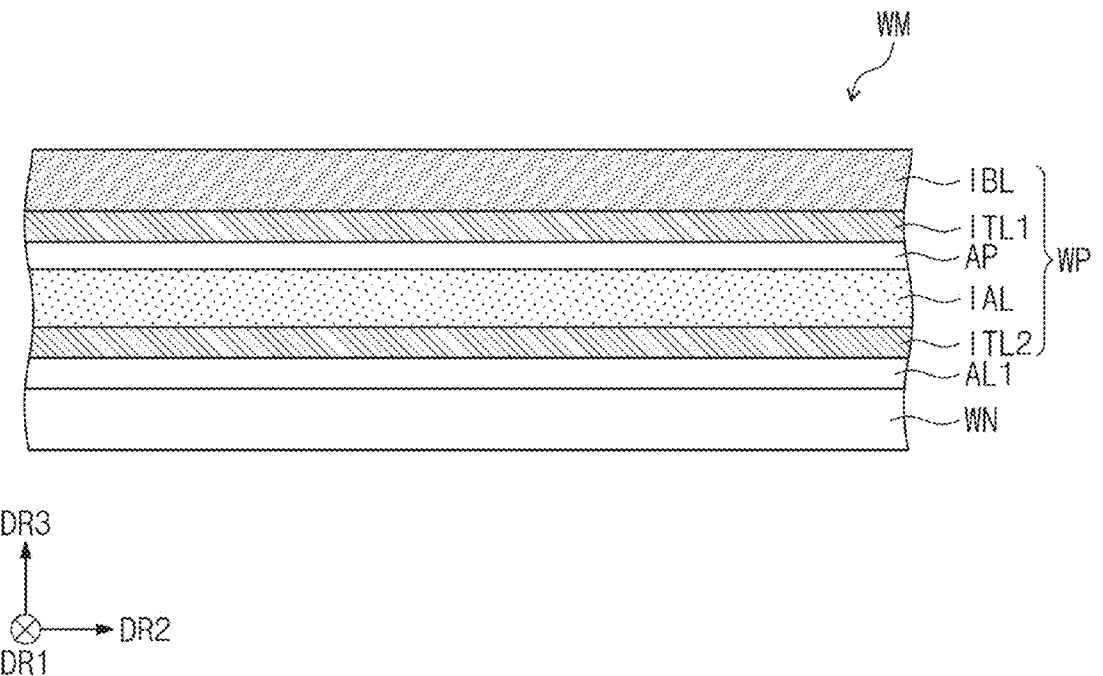
FIGS. 7A to 7D are cross-sectional views of an embodiment of a window module according to the disclosure.

The window protection layer WP may include a plurality of impact transmitting layers. Referring to FIG. 7A, the window protection layer WP may include first and second impact transmitting layers ITL1 and ITL2. The above description of the impact transmitting layer ITL (refer to FIG. 6A) may be applied to the first impact transmitting layer ITL1 and the second impact transmitting layer ITL2.

The first impact transmitting layer ITL1 may be disposed between the barrier layer IBL and the impact absorbing layer IAL. The first impact transmitting layer ITL1 may contact the rear surface of the barrier layer IBL. The first impact transmitting layer ITL1 may be formed on the rear surface of the barrier layer IBL through deposition.

The second impact transmitting layer ITL2 may be disposed between the impact absorbing layer IAL and the base film WN. The second impact transmitting layer ITL2 may contact a rear surface of the impact absorbing layer IAL. The second impact transmitting layer ITL2 may be formed on the rear surface of the impact absorbing layer IAL through deposition.

The first impact transmitting layer ITL1 and the second impact transmitting layer ITL2 may each include graphene or carbon nanotubes. The first impact transmitting layer ITL1 may horizontally transmit an external impact applied to the barrier layer IBL from the outside. The impact absorbing layer IAL may absorb the external impact horizontally transmitted and dispersed by the first impact transmitting layer ITL1. The second impact transmitting layer ITL2 may horizontally transmit the energy of the external impact that remains in the impact absorbing layer IAL after being absorbed in the impact absorbing layer IAL. Since the window protection layer WP includes the first and second impact transmitting layers ITL1 and ITL2 respectively disposed above and under the impact absorbing layer IAL, the impact resistance of the window protection layer WP may be improved.

Figure 7B:
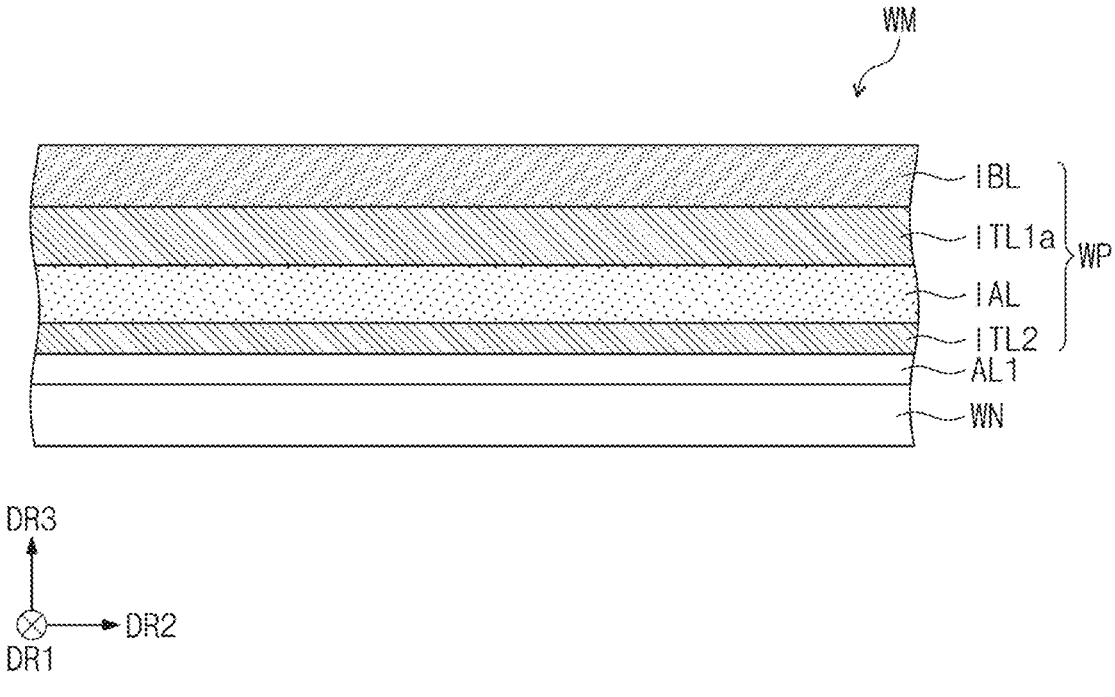

Referring to FIG. 7B, a first impact transmitting layer ITL1a may include an adhesive resin and may include graphene or carbon nanotubes dispersed in the adhesive resin. The first impact transmitting layer ITL1a may contact the barrier layer IBL and the impact absorbing layer IAL to couple the barrier layer IBL and the impact absorbing layer IAL and may horizontally transmit an external impact. Due to this, the adhesive part AP (refer to FIG. 7A) disposed between the barrier layer IBL and the impact absorbing layer IAL may be omitted.

Figure 7C:
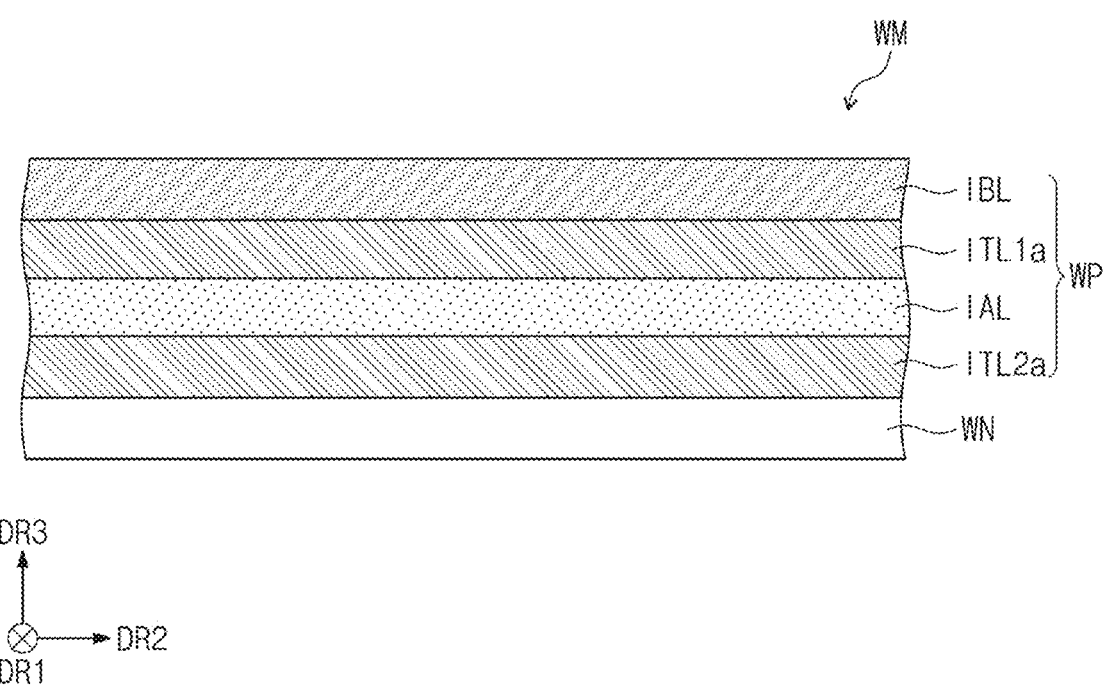

Referring to FIG. 7C, a first impact transmitting layer ITL1a and a second impact transmitting layer ITL2a may each include an adhesive resin and graphene or carbon nanotubes dispersed in the adhesive resin. The second impact transmitting layer ITL2a may contact the impact absorbing layer IAL and the base film WN to couple the impact absorbing layer IAL and the base film WN and may horizontally transmit an external impact. Due to this, the first adhesive layer AL1 (refer to FIG. 7B) disposed between the window protection layer WP and the base film WN may be omitted.

Figure 7D:
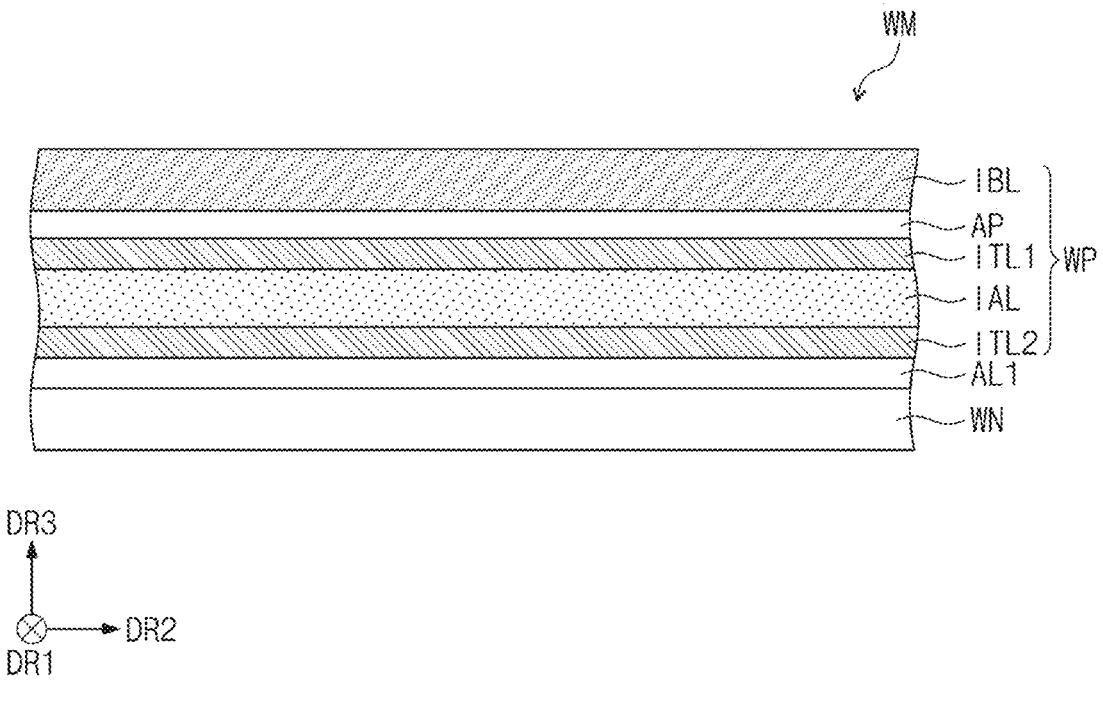

Referring to FIG. 7D, the first impact transmitting layer ITL1 and the second impact transmitting layer ITL2 may be disposed on the upper surface and the rear surface of the impact absorbing layer IAL, respectively. That is, the first impact transmitting layer ITL1 and the second impact transmitting layer ITL2 may be formed by depositing graphene or carbon nanotubes on the opposite surfaces of the impact absorbing layer IAL. The impact absorbing layer IAL including opposite surfaces on which the first impact transmitting layer ITL1 and the second impact transmitting layer ITL2 are respectively formed may be coupled to the barrier layer IBL through the adhesive part AP and may be coupled to the base film WN through the first adhesive layer AL1.

Figure 8:
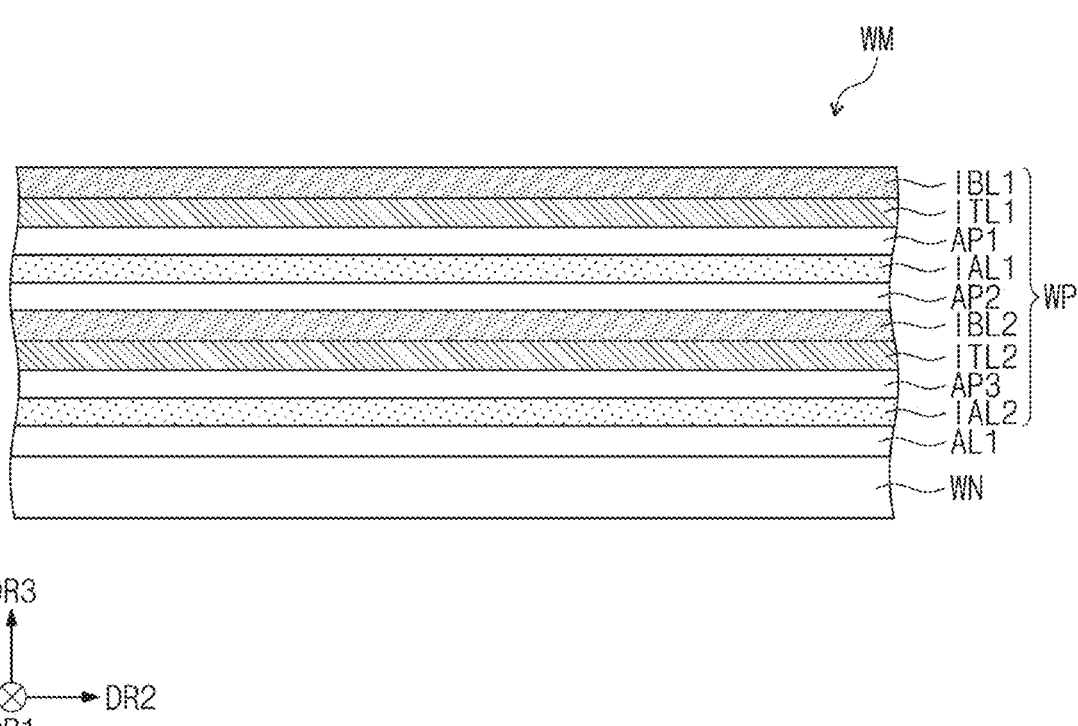
FIG. 8 is a cross-sectional view of an embodiment of a window module according to the disclosure.

FIG. 8 is a cross-sectional view of an embodiment of a window module WM according to the disclosure.

Referring to FIG. 8, a window protection layer WP may include a plurality of barrier layers IBL1 and IBL2, a plurality of impact transmitting layers ITL1 and ITL2, a plurality of impact absorbing layers IAL1 and IAL2, and a plurality of adhesive parts AP1, AP2, and AP3. The above description may be applied to the components of the window protection layer WP illustrated in FIG. 8.

The barrier layers IBL1 and IBL2, the impact transmitting layers ITL1 and ITL2, and the impact absorbing layers IAL1 and IAL2 may be disposed in the sequence of a barrier layer, an impact transmitting layer, and an impact absorbing layer in a direction from an upper surface to a lower surface of the window protection layer WP. That is, a plurality of stacked structures in each of which a barrier layer, an impact transmitting layer, and an impact absorbing layer are stacked one above another may be disposed in a thickness direction to form the window protection layer WP.

The first barrier layer IBL1 may be disposed at the top of window protection layer WP. The first impact transmitting layer ITL1 may be disposed on a rear surface of the first barrier layer IBL1. The first impact absorbing layer IAL1 may be disposed under the first impact transmitting layer ITL1. The first adhesive part AP1 may be disposed between the first impact transmitting layer ITL1 and the first impact absorbing layer IAL1 and may couple the first impact transmitting layer ITL1 and the first impact absorbing layer TALL. The stacked structure in which the first barrier layer IBL1, the first impact transmitting layer ITL1, the first adhesive part AP1, and the first impact absorbing layer IAL1 are stacked may be defined as a first protective layer.

The second barrier layer IBL2 may be disposed under the above-described first protective layer. That is, the second barrier layer IBL2 may be disposed under the first impact absorbing layer IAL1. The second impact transmitting layer ITL2 may be disposed on a rear surface of the second barrier layer IBL2. The second impact absorbing layer IAL2 may be disposed under the second impact transmitting layer ITL2. The third adhesive part AP3 may be disposed between the second impact transmitting layer ITL2 and the second impact absorbing layer IAL2 and may couple the second impact transmitting layer ITL2 and the second impact absorbing layer IAL2. The stacked structure in which the second barrier layer IBL2, the second impact transmitting layer ITL2, the third adhesive part AP3, and the second impact absorbing layer IAL2 are stacked may be defined as a second protective layer.

The second adhesive part AP2 may be disposed between the first impact absorbing layer IAL1 of the first protective layer and the second barrier layer IBL2 of the second protective layer. The first protective layer and the second protective layer may be coupled by the second adhesive part AP2.

A stacked structure of the window protection layer WP may be diversely designed depending on light transmittance, impact resistance, and folding characteristics desired for the window protection layer WP as long as the stacked structure includes an impact transmitting layer disposed between a barrier layer and an impact absorbing layer.

Figure 9A:
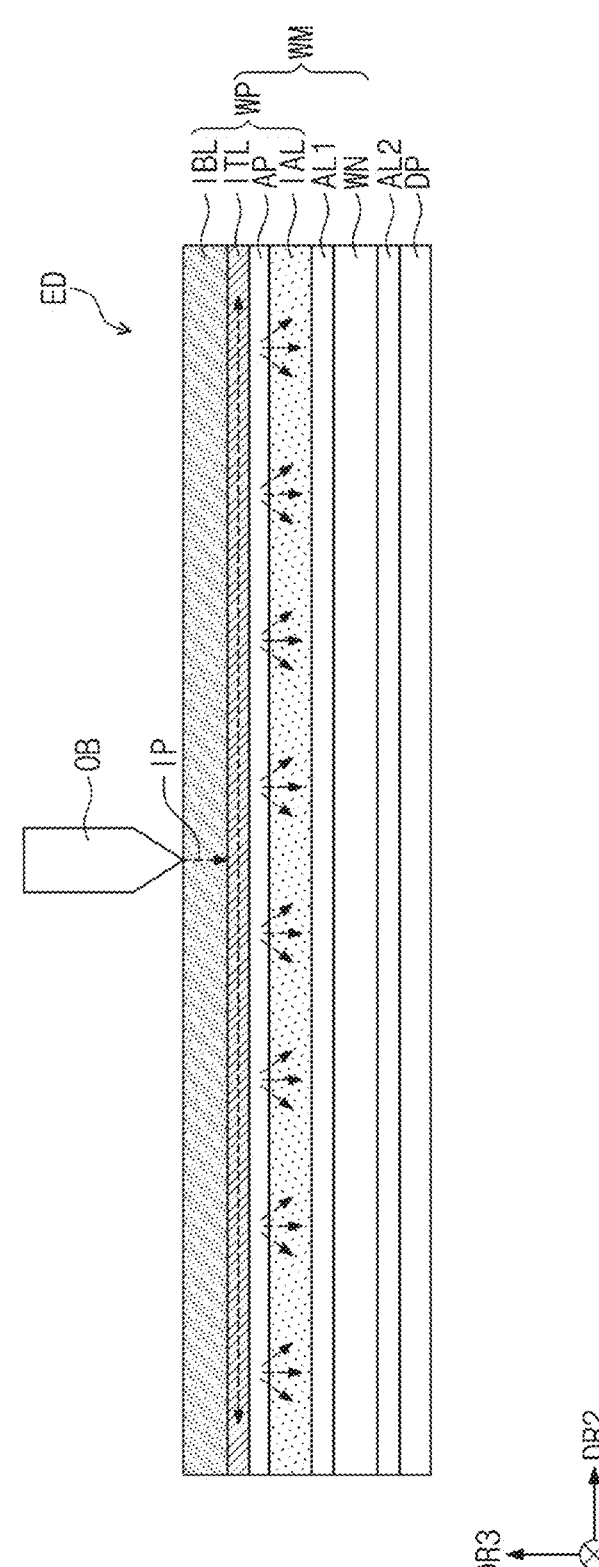
FIG. 9A is a cross-sectional view of an embodiment of a display device according to the disclosure.
Figure 9B:
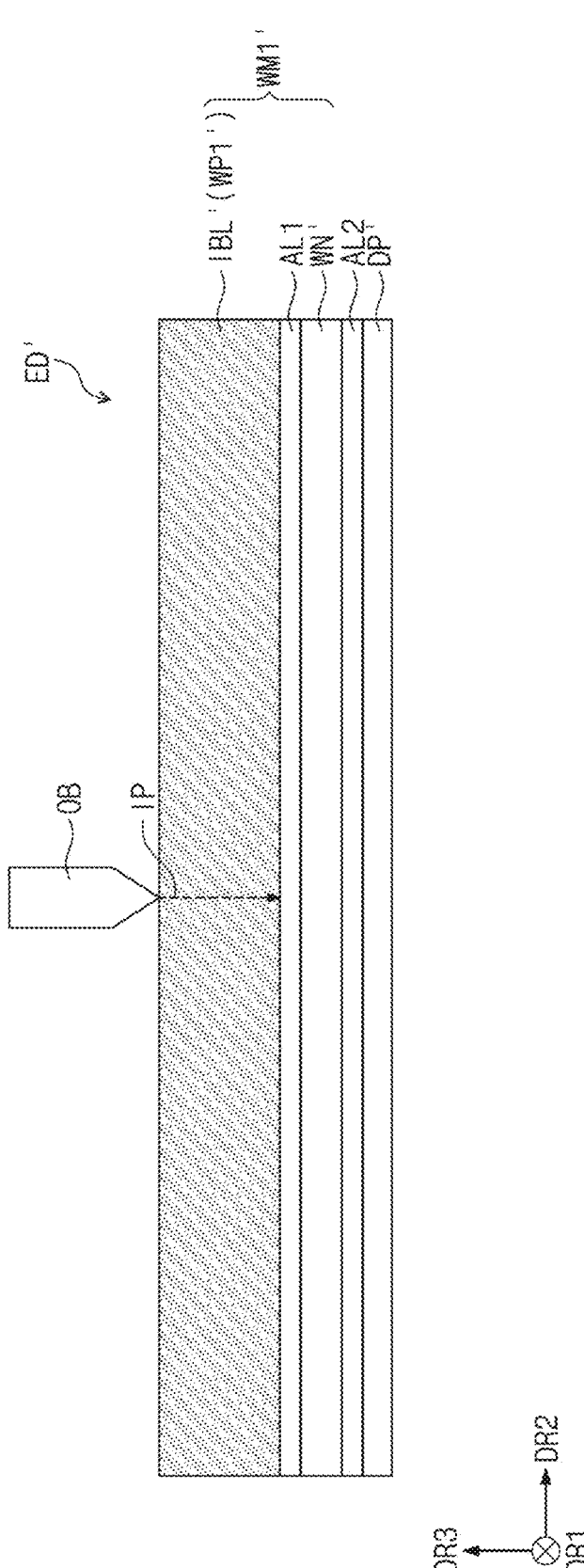
FIGS. 9B and 9C are cross-sectional views of a comparative example of a display device.
Figure 9C:
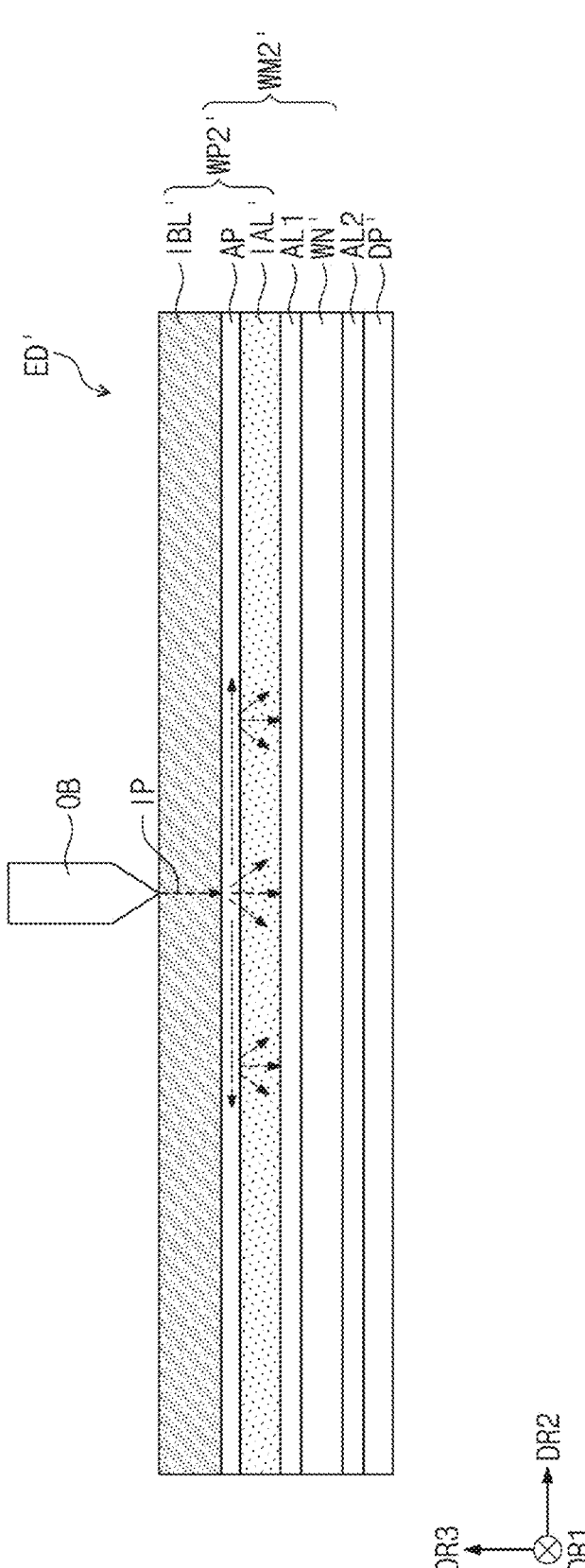

FIG. 9A is a cross-sectional view of an embodiment of a display device ED according to the disclosure. FIGS. 9B and 9C are cross-sectional views of a comparative example of a display device ED'.

Referring to FIG. 9A, the display device ED may include the display panel DP and the window module WM disposed on the display panel DP. The display panel DP and the window module WM may be coupled through the second adhesive layer AL2. The window module WM of FIG. 9A may correspond to the window module WM of FIG. 6A, and the above description may be identically applied.

The barrier layer IBL disposed at the top of the window protection layer WP may be disposed farther away from the display panel DP than the impact absorbing layer IAL is from the display panel. The impact absorbing layer IAL disposed at the bottom of the window protection layer WP may be disposed closer to the display panel DP than the barrier layer IBL. The impact transmitting layer ITL may be disposed between the barrier layer IBL and the impact absorbing layer IAL.

An external object OB may fall onto the display device ED to apply an external impact IP to the display device ED. The external impact IP may be preferentially transmitted to the window protection layer WP disposed at the top of the display device ED. The external impact IP may be preferentially transmitted to the barrier layer IBL disposed at the top of the window protection layer WP. The external impact IP may be vertically transmitted in the barrier layer IBL.

The external impact transmitted into the barrier layer IBL may be transmitted to the impact transmitting layer ITL disposed on the rear surface of the barrier layer IBL. Since the impact transmitting layer ITL includes graphene or carbon nanotubes, the impact transmitting layer ITL may rapidly horizontally transmit the external impact IP. Since the impact transmitting layer ITL horizontally transmits the external impact IP, the adhesive part AP may be prevented from being pressed or pushed at the point where the external object OB applies the impact.

The external impact IP horizontally transmitted in the impact transmitting layer ITL may be dispersed and absorbed in the impact absorbing layer IAL. Since the impact transmitting layer ITL horizontally transmits the external impact IP, the impact absorbing and alleviating effects of the impact absorbing layer IAL may be increased. Accordingly, the impact resistance of the window protection layer WP may be improved.

Referring to FIG. 9B, a window protection layer WP1' according to a first comparative example may include a single barrier layer IBL'. That is, the window protection layer WP1' according to the first comparative example does not include an impact transmitting layer and an impact absorbing layer.

An external object OB may fall onto the display device ED' to apply an external impact IP to the display device ED'. The external impact IP may be applied to the barrier layer IBL', and the barrier layer IBL' may vertically transmit the external impact IP. The external impact IP transmitted into the barrier layer IBL' may be transmitted to a first adhesive layer AL1, a base film WN', a second adhesive layer AL2 and a display panel DP' that are disposed under the barrier layer IBL'.

Since an impact transmitting layer and an impact absorbing layer are not disposed under the barrier layer IBL', the external impact IP may not be absorbed in the window protection layer WP1', and even though the same external impact IP is applied, the external impact IP having higher energy than that in the embodiment of the disclosure may be transmitted to the base film WN' and the display panel DP'. Furthermore, at the point where the external object OB applies the impact, the first adhesive layer AL1 may be pressed or pushed by the window protection layer WP1' having relatively low impact resistance. In addition, due to a window module WM1' having lower impact resistance than that in the embodiment of the disclosure, the display panel DP' according to the first comparative example may have a defect, such as a bright spot or a dark spot, when the external impact IP is applied.

Referring to FIG. 9C, a window protection layer WP2' according to a second comparative example may include a barrier layer IBL' and an impact absorbing layer IAL' and may include an adhesive part AP that couples the barrier layer IBL' and the impact absorbing layer IAL'. In the window protection layer WP2' according to the second comparative example, an impact transmitting layer is not disposed between the barrier layer IBL' and the impact absorbing layer IAL'.

An external object OB may fall onto the display device ED', and an external impact IP may be transmitted to the barrier layer IBL'. The external impact IP vertically transmitted into the barrier layer IBL' may be transmitted to the adhesive part AP. Due to this, the adhesive part AP may be pressed or pushed at the point where the external object OB applies the impact.

Since an impact transmitting layer is not disposed under the barrier layer IBL', the external impact IP may not be sufficiently transmitted in a horizontal direction, and the external impact IP having higher energy than that in the embodiment of the disclosure based on the same area may be transmitted to the impact absorbing layer IAL'. Due to this, the window protection layer WP2' and a window module WM2' according to the second comparative example may have lower impact resistance than that in the embodiment of the disclosure. Therefore, a display panel DP' according to the second comparative example may have a defect, such as a bright spot or a dark spot, when the external impact IP is applied.

Figure 10:
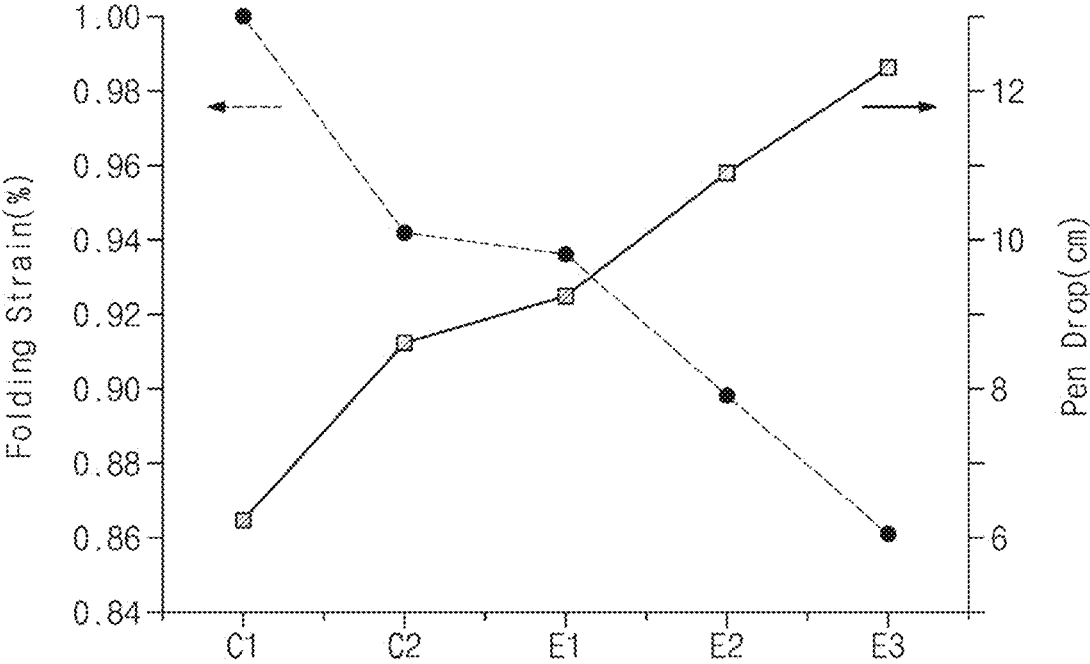
FIG. 10 is a graph depicting embodiments and comparative examples of folding strains and pen drop values.

FIG. 10 is a graph depicting embodiments and comparative examples of folding strains and pen drop values. Table 1 below shows the folding strains and the pen drop values in embodiments 1 to 3 and comparative examples 1 and 2 corresponding to FIG. 10.

In FIG. 10 and Table 1, "folding strain" indicates strain applied to a display device by folding and unfolding operations, and a relatively low folding strain means relatively excellent impact resistance. A "pen drop" result value indicates a drop height of a pen at which the pen is dropped onto the display device and causes damage to a display panel, and a relatively high pen drop result value means relatively excellent impact resistance.

In Table 1, the comparative example 1 corresponds to the first comparative example of FIG. 9B That is, the window protection layer of the comparative example 1 includes the single barrier layer IBL' (refer to FIG. 9B). The comparative example 2 corresponds to the second comparative example of FIG. 9C. That is, the window protection layer of the comparative example 2 includes the barrier layer IBL' (refer to FIG. 9C) and the impact absorbing layer IAL' (refer to FIG. 9C) coupled through the adhesive part AP (refer to FIG. 9C). The embodiments 1 to 3 correspond to the embodiment of FIG. 9A. Each of the window protection layers of the embodiments 1 to 3 includes the barrier layer IBL (refer to FIG. 9A), the impact transmitting layer ITL (refer to FIG. 9A), the adhesive part AP (refer to FIG. 9A), and the impact absorbing layer IAL (refer to FIG. 9A) that are sequentially stacked one above another. The embodiments 1 to 3 include the same configuration, but differ from one another in terms of the thickness of the impact transmitting layer ITL (refer to FIG. 9A).

TABLE 1

| Classification | Thickness of Impact Transmitting Layer (μm) | Folding Strain (%) | Pen Drop (cm) Minimum Value | Pen Drop (cm) Average Value |
|---|---|---|---|---|
| Comparative Example 1 (C1) | — | 0.999 | 6 | 6.2 |
| Comparative Example 2 (C2) | — | 0.942 | 8 | 8.6 |
| Embodiment 1 (E1) | 0.1 | 0.936 | 9 | 9.2 |
| Embodiment 2 (E2) | 0.5 | 0.898 | 10 | 10.8 |
| Embodiment 3 (E3) | 1.0 | 0.861 | 12 | 12.2 |

Referring to Table 1, the window protection layer of the comparative example 2 including the impact absorbing layer under the barrier layer may have a smaller folding stain (in terms of percentage) and a higher pen drop result value (in terms of centimeter) than those of the window protection layer of the comparative example 1 including the single barrier layer. That is, the impact absorbing layer may absorb the external impact applied to the display device and may improve the impact resistance of the window module.

The window protection layers of the embodiments 1 to 3, each of which includes the impact transmitting layer between the barrier layer and the impact absorbing layer, may have smaller folding strains and higher pen drop result values than those of the window protection layers of the comparative examples 1 and 2. That is, the window protection layers of the embodiments 1 to 3 may absorb an external impact having relatively high energy better than the window protection layers of the comparative examples 1 and 2. In the embodiments 1 to 3, the impact transmitting layer disposed between the barrier layer and the impact absorbing layer may horizontally transmit the external impact transmitted from the barrier layer, and the external impact horizontally transmitted into the impact transmitting layer may be dispersed and absorbed in the impact absorbing layer. Due to this, the impact dispersing and absorbing effects of the impact absorbing layer may be improved, and the impact resistances of the window protection layer and the window module may be improved.

When the embodiments 1 to 3 are compared with one another, as the thickness (in terms of micrometer) of the impact transmitting layer is increased, the folding strain may be decreased, and the pen drop result value may be increased. That is, as the thickness of the impact transmitting layer is increased, the impact resistance of the window protection layer may be improved, and the impact transmitting effect of the impact transmitting layer may be improved. However, when the impact transmitting layer has a thickness of a predetermined value or more, e.g., when the impact transmitting layer has a thickness of more than 5 micrometers (μm), the light transmittance of the window protection layer may be decreased, and the folding characteristics of the window protection layer may be deteriorated. Accordingly, by adjusting the thickness of the impact transmitting layer, the window module may have relatively excellent optical characteristics and improved impact resistance.

The window module in the embodiment of the disclosure includes the barrier layer and the impact absorbing layer that improve the impact resistance of the window module and includes the impact transmitting layer that is disposed between the barrier layer and the impact absorbing layer and that rapidly transmits an external impact.

Since the window module includes the impact transmitting layer, the impact alleviating effect of the impact absorbing layer may be maximized, the impact resistance of the window module may be improved, and the stacked components may be prevented from being pressed or pushed at the adhesive part between the stacked components in the window module.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A window module comprising:
a base film being optically clear; and
a window protection layer disposed on the base film, the window protection layer including:
a barrier layer disposed on the base film;
an impact absorbing layer disposed between the base film and the barrier layer;
a first impact transmitting layer disposed between the barrier layer and the impact absorbing layer; and
a second impact transmitting layer disposed between the impact absorbing layer and the base film,
wherein a modulus of the impact absorbing layer is less than a modulus of the barrier layer, and the first and second impact transmitting layers includes graphene or carbon nanotubes,
wherein the modulus of the barrier layer is about 2 gigapascals or more and about 8 gigapascals or less,
wherein the modulus of the impact absorbing layer is about 300 megapascals or more and about 1.5 gigapascals or less, and
wherein another barrier layer is not disposed between the base film and the barrier layer.

2. The window module of claim 1, wherein a thickness of the first impact transmitting layer is about 0.1 nanometer or more and about 5 micrometers or less.

3. The window module of claim 1, wherein a haze of the window protection layer is about 3% or less.

4. The window module of claim 1, wherein a light transmittance of the window protection layer is about 80% or more.

5. The window module of claim 1, wherein the barrier layer includes at least one of polyimide, polyethyleneterephthalate, polycarbonate, or polymethylmethacrylate.

6. The window module of claim 1, wherein the impact absorbing layer includes at least one of thermoplastic polyurethane, thermoset polyurethane, polyether block amide, copolyester thermoplastic elastomer, or silicone.

7. The window module of claim 1, wherein the first impact transmitting layer contacts a rear surface of the barrier layer.

8. The window module of claim 1, wherein the window protection layer further includes an adhesive part disposed between the first impact transmitting layer and the impact absorbing layer.

9. The window module of claim 1, wherein the first impact transmitting layer includes a resin having an adhesive force, and the graphene or the carbon nanotubes are dispersed in the resin.

10. The window module of claim 9, wherein the first impact transmitting layer contacts the barrier layer and the impact absorbing layer.

11. The window module of claim 10, wherein the first impact transmitting layer contacts an upper surface of the impact absorbing layer, and the second impact transmitting layer contacts the rear surface of the impact absorbing layer.

12. The window module of claim 1, further comprising:
a functional coating layer disposed on the window protection layer, the functional coating layer including at least one of a hard coating layer, an anti-fingerprint layer, or an antistatic layer.

13. An electronic device comprising:
a display device comprising:
a display panel; and
a window module including:
a base film disposed on the display panel; and
a window protection layer disposed on the base film, the window protection layer including:
a barrier layer;
a first impact transmitting layer;
an impact absorbing layer; and
a second impact transmitting layer disposed between the base film and the impact absorbing layer sequentially disposed toward the base film in a thickness direction,
wherein a modulus of the impact absorbing layer is less than a modulus of the barrier layer, and
wherein the first and second impact transmitting layers includes graphene or carbon nanotubes,
wherein the modulus of the barrier layer is about 2 gigapascals or more and about 8 gigapascals or less, and the modulus of the impact absorbing layer is about 300 megapascals or more and about 1.5 gigapascals or less, and
wherein another barrier layer is not disposed between the base film and the barrier layer.

14. The electronic device of claim 13, wherein a thickness of the first impact transmitting layer is about 0.1 nanometer to about 5 micrometers.

15. The electronic device of claim 13, wherein a haze of the window protection layer is about 3% or less, and a light transmittance of the window protection layer is about 80% or more.

* * * * *